United States Patent [19]
Saitoh et al.

[11] Patent Number: 4,592,979
[45] Date of Patent: Jun. 3, 1986

[54] PHOTOCONDUCTIVE MEMBER OF AMORPHOUS GERMANIUM AND SILICON WITH NITROGEN

[75] Inventors: Keishi Saitoh, Ibaraki; Yukihiko Ohnuki, Kawasaki; Shigeru Ohno, Yokohama, all of Japan

[73] Assignee: Canon Kabushiki Kaisha, Tokyo, Japan

[21] Appl. No.: 647,730

[22] Filed: Sep. 6, 1984

[30] Foreign Application Priority Data

Sep. 9, 1983 [JP] Japan .................. 58-167072
Sep. 13, 1983 [JP] Japan .................. 58-170379
Nov. 7, 1983 [JP] Japan .................. 58-208811
Dec. 27, 1983 [JP] Japan .................. 58-244738
Dec. 28, 1983 [JP] Japan .................. 58-245301
Dec. 28, 1983 [JP] Japan .................. 58-245305

[51] Int. Cl.$^4$ ........................... G03G 5/082
[52] U.S. Cl. ........................ 430/57; 430/65; 430/67; 430/84; 430/95
[58] Field of Search ............ 430/65, 57, 95, 66, 430/67, 84

[56] References Cited

U.S. PATENT DOCUMENTS 4,490,453 12/1984 Shirai et al. .................. 430/57
4,491,626 1/1985 Kawamura et al. ........... 430/95

Primary Examiner—John L. Goodrow
Attorney, Agent, or Firm—Fitzpatrick, Cella, Harper & Scinto

[57] ABSTRACT

A photoconductive member comprises a substrate for photoconductive member and a light receiving layer having photoconductivity comprising an amorphous material containing silicon atoms and germanium atoms, said light receiving layer containing nitrogen atoms and having a first layer region, a third layer region and a second layer region with the nitrogen atom content in the layer thickness direction of C(1), C(3) and C(2), respectively, in the order from the substrate side (with the proviso that when C(3) cannot solely be the maximum and either one of C(1) and C(2) is zero, the other two are not zero and not equal to each other, or when C(3) is zero, the other two are not zero, or when none of C(1), C(2) and C(3) is zero, the three of C(1), C(2) and C(3) cannot be equal at the same time and C(3) cannot solely be the maximum).

70 Claims, 22 Drawing Figures

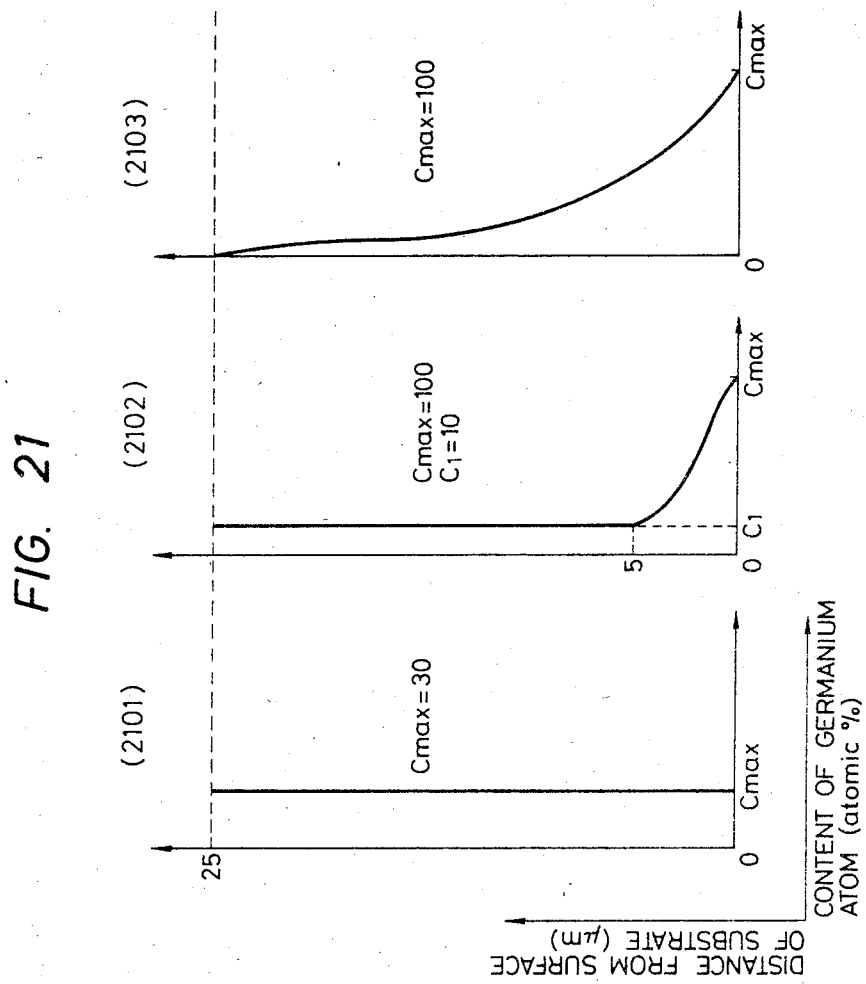

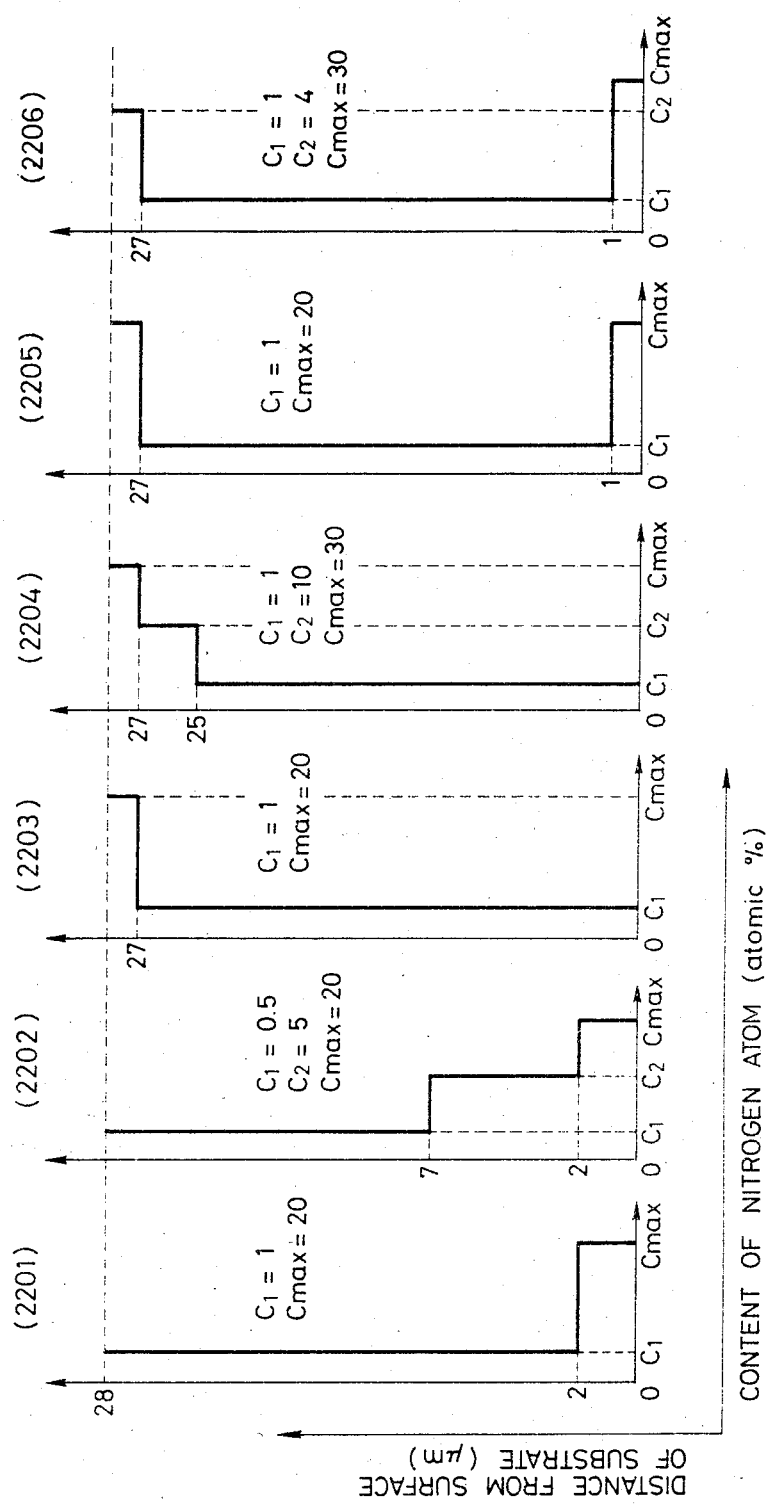

PHOTOCONDUCTIVE MEMBER OF AMORPHOUS GERMANIUM AND SILICON WITH NITROGEN

BACKGROUND OF THE INVENTION

1. Field of the Invention

This invention relates to a photoconductive member having sensitivity to electromagnetic waves such as light (herein used in a broad sense, including ultraviolet rays, visible light, infrared rays, X-rays, gamma-rays, and the like).

2. Description of the Prior Art

Photoconductive materials, which constitute photoconductive layers in solid state image pickup devices, image forming members for electrophotography in the field of image formation, or manuscript reading devices and the like, are required to have a high sensitivity, a high SN ratio [photocurrent ($I_p$)/dark current ($I_d$)], spectral characteristics matching to those of electromagnetic waves to be irradiated, a rapid response to light, a desired dark resistance value as well as no harm to human bodies during usage. Further, in a solid state image pick-up device, it is also required that the residual image should easily be treated within a predetermined time. Particularly, in case of an image forming member for electrophotography to be assembled in an electrophotographic device to be used in an office as office apparatus, the aforesaid harmless characteristic is very important.

From the standpoint as mentioned above, amorphous silicon (hereinafter referred to as a-Si) has recently attracted attention as a photoconductive material. For example, German OLS Nos. 2746967 and 2855718 disclose applications of a-Si for use in image forming members for electrophotography, and German OLS No. 2933411 discloses an application of a-Si for use in a photoelectric transducing reading device.

However, under the present situation the photoconductive members of the prior art having photoconductive layers constituted of a-Si are further required to be improved in a balance of overall characteristics including electrical, optical and photoconductive characteristics such as dark resistance value, photosensitivity and response to light, etc., and environmental characteristics during use such as humidity resistance, and further stability with the lapse of time.

For instance, when the above photoconductive member is applied in an image forming member for electrophotography, residual potential is frequently observed to remain during use thereof if improvements to higher photosensitivity and higher dark resistance are scheduled to be effected at the same time. When such a photoconductive member is repeatedly used for a long time, there will be caused various inconveniences such as accumulation of fatigues by repeated uses or so called ghost phenomenon wherein residual images are formed, or response characteristic will gradually be lowered when used at high speed repeatedly.

Further, a-Si has a relatively smaller coefficient of absorption of the light on the longer wavelength side in the visible light region as compared with that on the shorter wavelength side. Accordingly, in matching to the semiconductor laser practically applied at the present time, the light on the longer wavelength side cannot effectively be utilized, when employing a halogen lamp or a fluorescent lamp as the light source. Thus, various points remain to be improved.

On the other hand, when the light irradiated is not sufficiently absorbed in the photoconductive layer, but the amount of the light reaching the substrate is increased, interference due to multiple reflection may occur in the photoconductive layer to become a cause for "unfocused" image, in the case when the substrate itself has a high reflectance against the light transmitted through the photoconductive layer.

This effect will be increased, if the irradiated spot is made smaller for the purpose of enhancing resolution, thus posing a great problem in the case of using a semiconductor laser as the light source.

Further, a-Si materials to be used for constituting the photoconductive layer may contain as constituent atoms hydrogen atoms or halogen atoms such as fluorine atoms, chlorine atoms, etc. for improving their electrical, photoconductive characteristics, boron atoms, phosphorus atoms, etc. for controlling the electroconduction type as well as other atoms for improving other characteristics. Depending on the manner in which these constituent atoms are contained, there may sometimes be caused problems with respect to electrical or photoconductive characteristics of the layer formed.

That is, for example, in many cases, the life of the photocarriers generated by light irradiation in the photoconductive layer formed is insufficient, or at the dark portion, the charges injected from the substrate side cannot sufficiently be impeded.

Further, when the layer thickness is as thick as ten and some microns or higher, there tend to occur such phenomena as loosening or peeling of layers off from the substrate surface or formation of cracks in the layers with lapse of time when left to stand in air after taking out from a vacuum deposition chamber for layer formation. These phenomenon will occur particularly frequently when the substrate is a drumshaped substrate conventionally employed in the field of electrophotography. Thus, there are problems to be solved with respect to stability with lapse of time.

Accordingly, while attempting to improve the characteristics of a-Si material per se on one hand, it is also required to make efforts to overcome all the problems as mentioned above in designing of the photoconductive member on the other hand.

In view of the above points, the present invention contemplates the achievement obtained as a result of extensive studies made comprehensively from the standpoints of applicability and utility of a-Si as a photoconductive member for image forming members for electrophotography, solid state image pick-up devices, reading devices, etc. It has now been found that a photoconductive member having a layer constitution comprising a light receiving layer exhibiting photoconductivity, which comprises an amorphous material containing at least one of hydrogen atom (H) and halogen atom (X) in a matric of silicon atoms (Si) and germanium atoms (Ge) such as so called hydrogenated amorphous silicon germanium, halogenated amorphous silicon germanium, or halogen-containing hydrogenated amorphous silicon [hereinafter referred to comprehensively as a-SiGe(H,X)], said photoconductive member being prepared by designing so as to have a specific structure as hereinafter described, not only exhibits practically extremely excellent characteristics but also surpass the photoconductive members of the prior art in substantially all respects, especially having markedly excellent characteristics as a photoconductive member for electrophotography and also excellent absorption spectrum characteristics on the longer wavelength side.

SUMMARY OF THE INVENTION

A primary object of the present invention is to provide a photoconductive member having electrical, optical and photoconductive characteristics which are constantly stable and all-environment type with virtually no dependence on the environments under use, which member is markedly excellent in photosensitive characteristics on the longer wavelength side and light fatigue resistance, and also excellent in durability without causing deterioration phenomenon when used repeatedly, exhibiting no or substantially no residual potential observed.

Another object of the present invention is to provide a photoconductive member which is high in photosensitivity throughout the whole visible light region, particularly excellent in matching to a semiconductor laser and also rapid in response, to light.

Another object of the present invention is to provide a photoconductive member which is excellent in adhesion between a substrate and a layer provided on the substrate or between respective laminated layers, stable with closeness of structural arrangement and high in layer quality.

Still another object of the present invention is to provide a photoconductive member having sufficiently an ability to retain charges during charging treatment for formation of electrostatic images, when applied as a member for formation of an electrophotographic image and having excellent electrophotographic characteristics which is not substantially lowered even in a humid atmosphere, for which ordinary electrophotographic methods can very effectively be applied.

Further, still another object of the present invention is to provide a photoconductive member for electrophotography, which can easily provide an image of high quality which is high in density, clear in halftone, high in resolution and free from "unfocused" image.

Still another object of the present invention is to provide a photoconductive member having high photosensitivity and high SN ratio characteristic, and a good electrical contact with the substrate.

According to one aspect of the present invention, there is provided a photoconductive member comprising a substrate for photoconductive member and a light receiving layer having photoconductivity comprising an amorphous material containing silicon atoms and germanium atoms, said light receiving layer containing nitrogen atoms and having a first layer region, a third layer region and a second layer region with the nitrogen atom content in the layer thickness direction of C(1), C(3) and C(2), respectively, in the order from the substrate side [with the proviso that when C(3) cannot solely be the maximum and either one of C(1) and C(2) is zero, the other two are not zero and not equal to each other, or when C(3) is zero, the other two are not zero, or when none of C(1), C(2) and C(3) is zero, the three of C(1), C(2) and C(3) cannot be equal at the same time and C(3) cannot solely be the maximum].

According to another aspect of the present invention, there is provided a photoconductive member comprising a substrate for photoconductive member and a light receiving layer having a layer constitution in which a first layer region (G) comprising an amorphous material containing germanium atoms, optionally together with at least one of silicon atoms, hydrogen atoms and halogen atoms [hereinafter written as "a-Ge(Si, H, X)"] and a second layer region (S) exhibiting photoconductivity comprising an amorphous material containing silicon atoms, optionally together with at least one of hydrogen atoms and halogen atoms [hereinafter written as "a-Si(H,X)"] are successively provided from the substrate side, said light receiving layer containing nitrogen atoms and having a first layer region, a third layer region and a second layer region with the nitrogen atom content in the layer thickness direction of C(1) C(3) and C(2), respectively, in the order from the substrate side [with the proviso that when C(3) cannot solely be the maximum and either one of C(1) and C(2) is zero, the other two are not zero and not equal to each other, or when C(3) is zero, the other two are not zero, or when none of C(1), C(2) and C(3) is zero, the three of C(1), C(2) and C(3) cannot be equal at the same time and C(3) cannot solely be the maximum].

BRIEF DESCRIPTION OF THE DRAWINGS

FIGS. 21 and 22 each shows a depth profile of the respective atoms in Examples of the present invention.

DETAILED DESCRIPTION OF THE PREFERRED EMBODIMENTS

Figure 1:
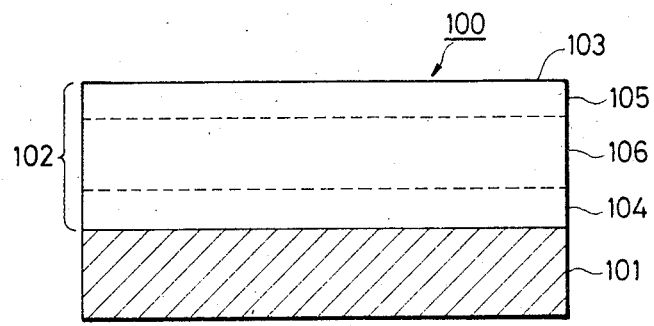
FIGS. 1, 16, 17, 18 and 19 each shows a schematic sectional view for illustration of the layer constitution of a preferred embodiment of the photoconductive member according to the present invention.

Referring now to the drawings, the photoconductive members according to the present invention are to be described in detail below.

FIG. 1 shows a schematic sectional view for illustration of the layer structure of a first preferred embodiment of the constitution of the photoconductive member of this invention.

The photoconductive member 100 as shown in FIG. 1 has a substrate 101 for photoconductive member and a light receiving layer 102 formed on said substrate 101, said light-receiving layer comprising a-SiGe(H,X), containing nitrogen atoms and having photoconductivity.

The germanium atoms contained in the light receiving layer 102 may be distributed evenly throughout the light receiving layer 102, or may be distributed ununiformly in content although contained everywhere in the layer thickness direction. However, in either case, it is required also for uniformizing the characteristics in the interplanar direction that germanium atoms should be contained uniformly within the plane in parallel to the surface of the substrate.

In particular, germanium atoms are contained in the light receiving layer 102 everywhere in the layer thickness direction but more enriched on the side of the substrate 101 than the side opposite to the side where the aforesaid substrate 101 is provided (namely the free surface 103 side of the light receiving layer 102), or in a distribution contrary to such a distribution.

The light receiving layer 102 of the photoconductive member 100 shown in FIG. 1 contains nitrogen atoms, and has a first layer region (1) 104 with a nitrogen content in the layer thickness direction of a value C(1), a second layer region (2) 105 of a value C(2) and a third layer region (3) 106 of a value C(3).

In the present invention, it is not necessarily required that nitrogen atoms should be contained in all of the three layer regions of the above first, second and third layer regions. However, when no nitrogen atom is contained in either one of the layer regions, nitrogen atoms are necessarily contained in the other two layer regions, and the content in the layer thickness direction are required to be different in those layer regions, the nitrogen atom content in the third layer region being not solely the maximum. In other words, when either one of C(1), C(2) and C(3) is 0, the respective layer regions are required to be formed so that the other two are not 0 and not equal to each other and C(3) should not be solely the maximum.

Also, when nitrogen atoms are contained in all of the first, second and third layer regions, nitrogen atoms are contained in respective layer regions so that the respective content in the three layers cannot be equal at the same time and the content in the third layer region cannot be solely the maximum. In short, when neither of C(1), C(2) and C(3) is zero, the three of C(1), C(2) and C(3) cannot be equal at the same time and C(3) cannot be solely the maximum.

By doing so, when charging treatment is applied, injection of charges from the side of the free surface 103 or the side of the substrate 101 into the light receiving layer 102 can effectively be inhibited, and at the same time improvement of dark resistance of the light receiving layer 102 itself as well as improvement of adhesion between the substrate 101 and the light receiving layer 102 can be effected.

In order that the light receiving layer 102 may have practically satisfactory photosensitivity and dark resistance and injection of charges into the light receiving layer 102 may be sufficiently inhibited, and also that transport of the photocarriers generated in the light receiving layer 102 may be effectively done, it is necessary to design the light receiving layer 102 so that the content C(3) of nitrogen atoms in the third layer region (3) may not be solely the maximum. In this case, preferably, the layer thickness of the third layer region (3) is desired to be sufficiently thicker than the layer thicknesses of the other two layer regions. More preferably, the light receiving layer 102 should desirably be designed so that the layer thickness of the third layer (3) may comprise at least 1/5 of the layer thickness of the light receiving layer 102.

In the present invention, the layer thickness of the first layer region (1) and the second layer region (2) should preferably be 0.003 to 30 $\mu$, more preferably 0.004 to 20 $\mu$, most preferably 0.005 to 10 $\mu$. On the other hand, the layer thickness of the third layer region (3) should preferably be 1 to 100 $\mu$, more preferably 1 to 80 $\mu$, most preferably 2 to 50 $\mu$.

When the light receiving layer is designed so as to impart primarily the function of the so called charge injection inhibiting layer, which inhibits injection of charges into the light receiving layer, to the first layer region (1) and the second layer region (2), each of the layer thicknesses of the first layer region (1) and the second layer region (2) should desirably be made 10 $\mu$ at its maximum.

When the light receiving layer is designed so as to impart primarily the function of charge generating layer to the third layer region (3), the layer thickness of the layer region (3) is determined suitably depending on the absorption coefficient of light of the light source employed. In this case, if a light source conventionally used in the field of electrophotography is to be employed, the layer thickness of the third layer region (3) may be at most about 10 $\mu$. In order to impart primarily the function of charge transport layer to the third layer region (3), its thickness should desirably be at least 5 $\mu$.

In the present invention, the maximum value of the content of nitrogen atoms C(1), C(2), and C(3) should preferably be 67 atomic % or less, more preferably 50 atomic % or less, most preferably 40 atomic % or less based on the sum T(SGN) of silicon atoms, germanium atoms and nitrogen atoms. When neither one of C(1), C(2) and C(3) is zero, the minimum value of the content of nitrogen atoms C(1), C(2) and C(3) should preferably be 1 atomic ppm or more, more preferably 50 atomic ppm or more, most preferably 100 atomic ppm or more based on the sum T(SGN) of silicon atoms, germanium atoms and nitrogen atoms.

FIGS. 2 through 10 show typical examples of ununiform distribution in the direction of layer thickness of germanium atoms contained in the light receiving layer of the photoconductive member in the present invention.

In FIGS. 2 through 10, the abscissa indicates the content C of germanium atoms and the ordinate the layer thickness of the light receiving layer exhibiting photoconductivity, $t_B$ showing the position of the surface on the substrate side and $t_T$ the position of the surface of the light receiving layer on the side opposite to the substrate side. That is, layer formation of the light receiving layer containing germanium atoms proceeds from the $t_B$ side toward the $t_T$ side.

Figure 2:
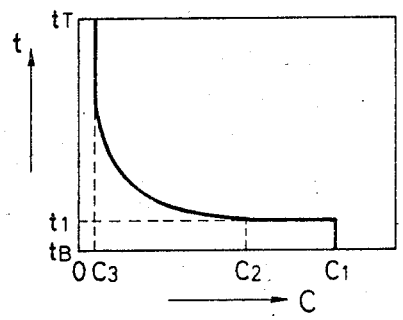
FIGS. 2 to 10 each shows a schematic illustration of the depth profiles of germanium atoms in the light receiving layer.

In FIG. 2, there is shown a first typical embodiment of the depth profile of germanium atoms in the layer thickness direction contained in the light receiving layer.

In the embodiment as shown in FIG. 2, from the interface position $t_B$ at which the surface, on which the light receiving layer containing germanium atoms is to be formed, is contacted with the surface of said light receiving layer to the position $t_1$, germanium atoms are contained in the light receiving layer formed, while the content C of germanium atoms taking a constant value of $C_1$, the content being gradually decreased from the content $C_2$ continuously from the position $t_1$ to the interface position $t_T$. At the interface position $t_T$, the content C of germanium atoms is made $C_3$.

Figure 3:
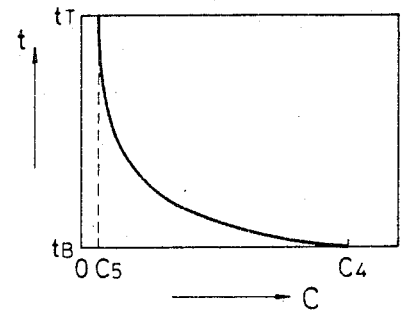

In the embodiment shown in FIG. 3, the content C of germanium atoms contained is decreased gradually and continuously from the position $t_B$ to the position $t_T$ from the content $C_4$ until it becomes the content $C_5$ at the position $t_T$.

Figure 4:
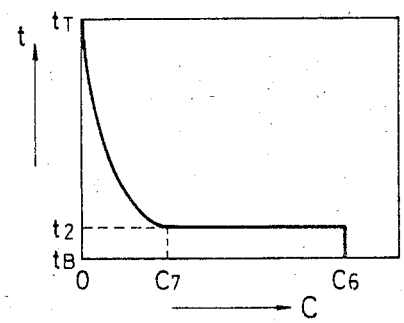

In case of FIG. 4, the content C of germanium atoms is made constant as $C_6$, gradually decreased continuously from the position $t_2$ to the position $t_T$, and the content C is made substantially zero at the position $t_T$ (substantially zero herein means the content less than the detectable limit).

Figure 5:
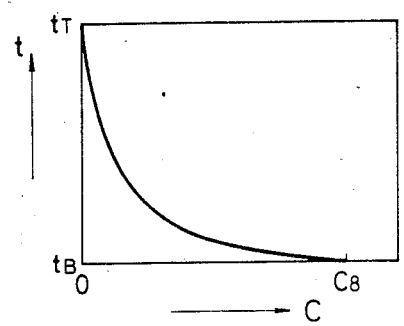

In case of FIG. 5, the content C of germanium atoms are decreased gradually and continuously from the position $t_B$ to the position $t_T$ from the content $C_8$, until it is made substantially zero at the position $t_T$.

Figure 6:
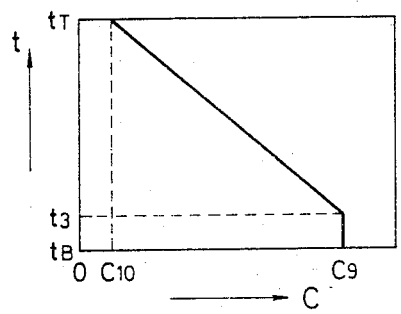

In the embodiment shown in FIG. 6, the content C of germanium atoms is constantly $C_9$ between the position $t_B$ and the position $t_3$, and it is made $C_{10}$ at the position $t_T$. Between the position $t_3$ and the position $t_T$, the content is reduced as a first order function from the position $t_3$ to the position $t_T$.

Figure 7:
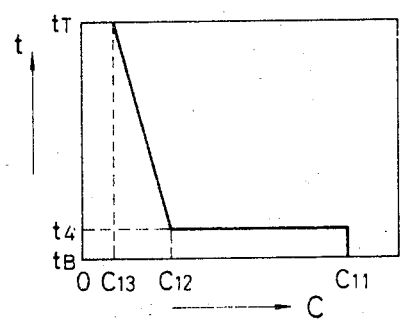

In the embodiment shown in FIG. 7, there is formed a depth profile such that the content C takes a constant value of $C_{11}$ from the position $t_B$ to the position $t_4$, and is decreased as a first order function from the content $C_{12}$ to the content $C_{13}$ from the position $t_4$ to the position $t_T$.

Figure 8:
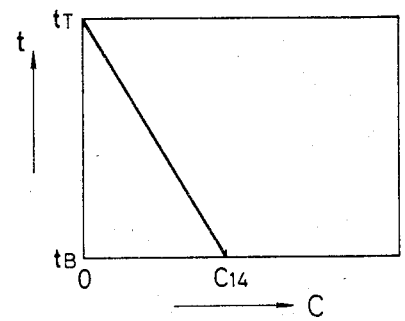

In the embodiment shown in FIG. 8, the content C of germanium atoms is decreased as a first order function from the content $C_{14}$ to zero from the position $t_B$ to the position $t_T$.

Figure 9:
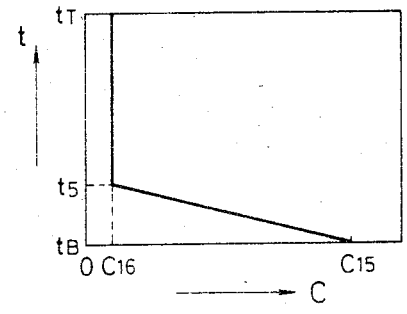

In FIG. 9, there is shown an embodiment, where the content C of germanium atoms is decreased as a first order function from the content $C_{15}$ to $C_{16}$ from the position $t_B$ to $t_5$ and made constantly at the content $C_{16}$ between the position $t_5$ and $t_T$.

Figure 10:
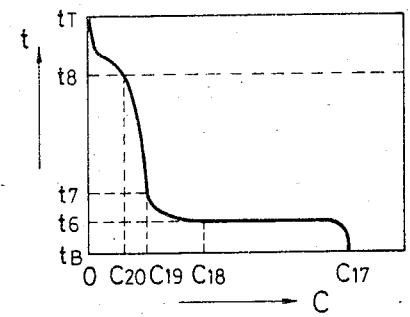

In the embodiment shown in FIG. 10, the content C of germanium atoms is at the content $C_{17}$ at the position $t_B$, which content $C_{17}$ is initially decreased gradually and abruptly near the position $t_6$ to the position $t_6$, until it is made the content $C_{18}$ at the position $t_6'$.

Between the position $t_6$ and the position $t_7$, the content C is initially decreased abruptly and thereafter gradually, until it is made the content $C_{19}$ at the position $t_7$. Between the position $t_7$ and the position $t_8$, the content is decreased very gradually to the content $C_{20}$ at the position $t_8$. Between the position $t_8$ and the position $t_T$, the content is decreased along the curve having a shape as shown in the Figure from the content $C_{20}$ to substantially zero.

As described above about some typical examples of depth profiles of germanium atoms contained in the light receiving layer in the direction of the layer thickness by referring to FIGS. 2 through 10, in the present invention, the light receiving layer is provided desirably in a depth profile so as to have a portion enriched in content C of germanium atoms on the substrate side and a portion depleted in content C of germanium atoms to considerably lower than that of the substrate side on the interface $t_T$ side.

The light receiving layer constituting the photoconductive member of the present invention is desired to have a localized region(A) containing germanium atoms preferably at a relatively higher content on the substrate side or alternatively on the free surface side as described above.

In the present invention, the localized region (A), as explained in terms of the symbols in FIG. 2 through FIG. 10, may be desirably provided within 5 $\mu$ from the interface position $t_B$.

In the present invention, the above localized region (A) may be made to be identical with the whole layer region ($L_T$) up to the depth of 5 $\mu$ from the interface position $t_B$, or alternatively a part of the layer region ($L_T$).

It may suitably be determined depending on the characteristics required for the light receiving layer to be formed, whether the localized region (A) is made a part or whole of the layer region ($L_T$).

The localized region (A) may preferably be formed according to such a layer formation that the maximum value Cmax of the content C of germanium atoms in a distribution in the layer thickness direction may preferably be 1000 atomic ppm or more, more preferably 5000 atomic ppm or more, most preferably $1 \times 10^4$ atomic ppm or more based on the sum of germanium atoms and silicon atoms.

That is, according to the present invention, the light receiving layer containing germanium atoms is formed so that the maximum value Cmax of the content may exist within a layer thickness of 5 $\mu$ from the substrate side (the layer region within 5 $\mu$ thickness from $t_B$).

In the present invention, the content of germanium atoms in the light receiving layer containing germanium atoms, which may suitably be determined as desired so as to achieve effectively the objects of the present invention, may preferably be 1 to $9.5 \times 10^5$ atomic ppm, more preferably 100 to $8 \times 10^5$ atomic ppm, most preferably 500 to $7 \times 10^5$ atomic ppm based on the sum with silicon atoms.

When the distribution of germanium atoms in the light receiving layer is such that germanium atoms are continuously distributed throughout the whole layer and the content C of germanium atoms in the layer thickness direction is given a change so as to be reduced from the substrate side to the free surface side of the light receiving layer, or a change contrary thereto, a light receiving layer having required characteristics can be realized as desired by designing freely the change rate curve of the content C as desired.

For example, by giving a change in the content C to the depth profile of germanium atoms so as to make sufficiently higher the content C in the light receiving layer on the substrate side, while reducing minimum on the free surface side of the light receiving, higher photosensitization can be effected to the light of all the region from relatively shorter wavelength to relatively longer wavelength, simultaneously with effective prevention of interference against interferable light such as laser beam.

Also, by making the content C of germanium atoms extremely great at the end portion of the substrate side of the light receiving layer, when a semiconductor laser is employed, the light on the longer wavelength side which cannot sufficiently be absorbed on the side of the light receiving layer irradiated by laser can be absorbed substantially completely at the end portion layer region of the light receiving layer, whereby interference caused by reflection against the substrate surface can effectively be prevented.

In the photoconductive member of the present invention, for the purpose of making higher photosensitivity and dark resistance, and further for the purpose of improving adhesion between the substrate and the light receiving layer, nitrogen atoms are contained in the light receiving layer. The nitrogen atoms to be contained in the light receiving layer may be contained everywhere in the whole layer region, while satisfying the above conditions, or alternatively locally only within a part of the layer region of the light receiving layer.

In the present invention, nitrogen atoms are distributed ununiformly in the layer thickness direction through the whole light receiving layer, but uniformly in the layer thickness direction in respective regions of the first, second and third regions.

FIGS. 11 through 15 show typical examples of depth profile of nitrogen atoms in the light receiving layer as a whole. In explanation of these Figures, the symbols have the same meanings as employed in FIG. 2 through 10, unless otherwise noted.

Figure 11:
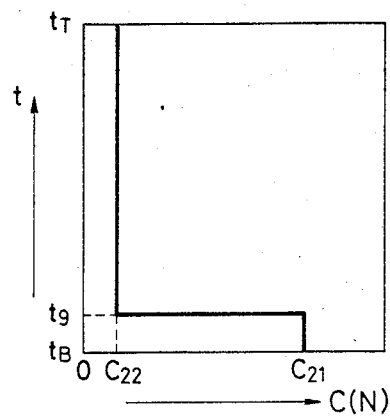
FIGS. 11 to 15 each shows a schematic illustration of the depth profile of nitrogen atoms in the light receiving layer.

In the embodiment shown in FIG. 11, from the position $t_B$ to the position $t_9$, the content of nitrogen atoms C(N) is made a constant value of $C_{21}$, while from the position $t_9$ to the position $t_T$, it is made constantly $C_{22}$.

Figure 12:
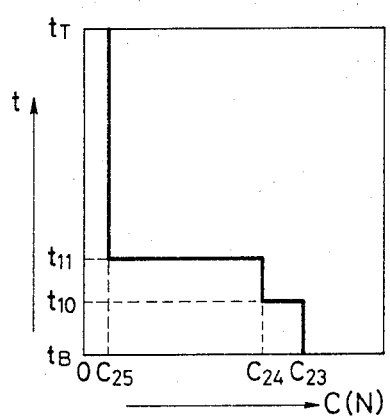

In the embodiment shown in FIG. 12, from the position $t_B$ to the position $t_{10}$, the content of nitrogen atoms C(N) is made a constant value of $C_{23}$, while it is made $C_{24}$ from the position $t_{10}$ to the position $t_{11}$, and $C_{25}$ from the position $t_{11}$ to the position $t_T$, thus being decreased in three stages.

Figure 13:
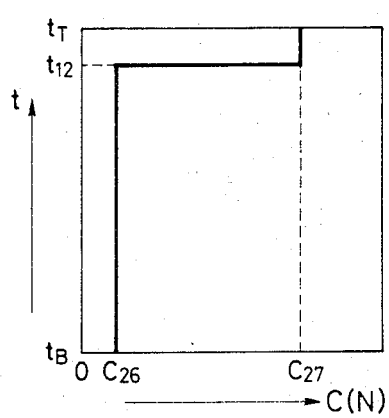

In the embodiment of FIG. 13, the content C(N) is made $C_{26}$ from the position $t_B$ to the position $t_{12}$, while it is made $C_{27}$ from the position $t_{12}$ to the position $t_T$.

Figure 14:
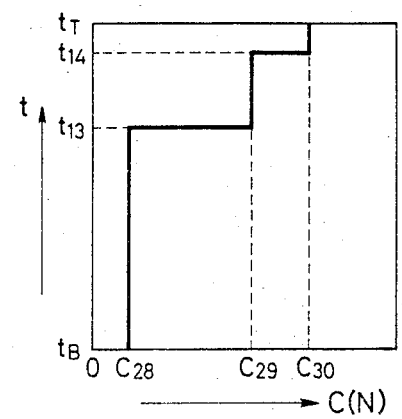

In the embodiment of FIG. 14, from the position $t_B$ to the position $t_{13}$, the content C(N) is made $C_{28}$, while it is made $C_{29}$ from the position $t_{13}$ to the position $t_{14}$, and $C_{30}$ from the position $t_{14}$ to the position $t_T$. Thus, the content of nitrogen atoms is increased in three stages.

Figure 15:
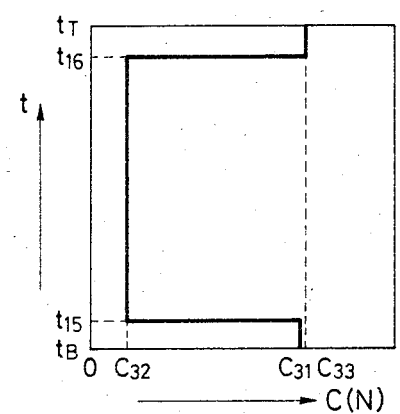

In the embodiment of FIG. 15, the nitrogen atoms content C(N) is made $C_{31}$ from the position $t_B$ to the position $t_{15}$, $C_{32}$ from the position $t_{15}$ to the position $t_{16}$ and $C_{33}$ from the position $t_{16}$ to the position $t_T$. The content is made higher on the substrate side and on the free surface side.

In the present invention, the layer region (N) containing nitrogen atoms provided in the light receiving layer (constituted of at least 2 layer regions of the first, second and third layer regions as described above) is provided so as to occupy the whole layer region of the light receiving layer when it is intended to improve primarily photosensitivity and dark resistance; or in the vicinity of the free surface for preventing injection of charges from the free surface of the light receiving layer; or so as to occupy the end portion layer region (E) on the substrate side of the light receiving layer for ensuring strengthening of adhesion between the substrate and the light receiving layer.

In the above first case, the content of nitrogen atoms in the layer region (N) is preferably made relatively smaller for maintaining high photosensitivity, while it is relatively larger in the second case for prevention of injection of charges from the free surface of the light receiving layer, and in the third case relatively larger for ensuring strengthening of adhesion to the substrate.

For accomplishing the above three cases at the same time, there may be created a layer region (N) having a depth profile of nitrogen atoms such as that they are contained in relatively higher content on the substrate side, in a relatively lower content at the central part of the light receiving layer and in greater amount of nitrogen atoms at the surface layer region on the free surface side of the light receiving layer.

In the present invention, the content of nitrogen atoms to be contained in the layer region (N) provided in the light receiving layer may be suitably selected depending on the characteristics required for the layer region (N) per se or, when said layer region (N) is provided in direct contact with the substrate, depending on the organic relationship such the relation with the characteristics at the contacted interface with said substrate and others.

When another layer region is to be provided in direct contact with said layer region (N), the content of nitrogen atoms may be suitably selected also with considerations about the characteristics of said another layer region and the relation with the characteristics of the contacted interface with said another layer region.

The content of nitrogen atoms in the layer region (N), which may suitably be determined as desired depending on the characteristics required for the photoconductive member to be formed, may be preferably 0.001 to 50 atomic %, more preferably 0.002 to 40 atomic %, most preferably 0.003 to 30 atomic % based on the sum T(SGN) of the three atoms of silicon atoms, germanium atoms and nitrogen atoms.

In the present invention, when the layer region (N) comprises the whole region of the light receiving layer or when, although it does not comprises the whole layer region, the layer thickness $T_N$ of the layer region (N) is sufficiently large relative to the layer thickness T of the light receiving layer, the upper limit of the content of nitrogen atoms in the layer region (N) should desirably be sufficiently smaller than the aforesaid value.

In the case of the present invention, in such a case when the ratio of the layer thickness $T_N$ of the layer region (N) relative to the layer thickness T of the light receiving layer is 2/5 or higher, the upper limit of the content of nitrogen atoms in the layer region (N) may preferably be 30 atomic % or less, more preferably 20 atomic % or less, most preferably 10 atomic % or less based on the sum T(SGN) of silicon atoms, germanium atoms and nitrogen atoms.

In the present invention, the layer region (N) containing nitrogen atoms for constituting the light receiving layer may preferably be provided so as to have a localized region (B) containing nitrogen atoms at a relatively higher content on the substrate side and in the vicinity of the free surface as described above, and in the former case adhesion between the substrate and the light receiving layer can be further improved, and improvement of accepting potential can also be effected.

The localized region (B), as explained in terms of the symbols shown in FIGS. 11 to 15, may be desirably provided within $5\mu$ from the interface position $t_B$ or the free surface $t_T$.

In the present invention, the above localized region (B) may be made to be identical with the whole layer region ($L_T$) up to the depth of $5\mu$ thickness from the interface position $t_B$ or the free surface $t_T$, or alternatively a part of the layer region ($L_T$).

It may suitably be determined depending on the characteristics required for the light receiving layer to be formed, whether the localized region (B) is made a part or whole of the layer region ($L_T$).

The localized region (B) may preferably formed according to such a layer formation that the maximum Cmax of the content C(N) of nitrogen atoms in a distribution in the layer thickness direction may preferably be 500 atomic ppm or more, more preferably 800 atomic ppm or more, most preferably 1000 atomic ppm or more.

That is, according to the present invention, the layer region (N) containing nitrogen atoms is formed so that the maximum value Cmax of the depth profile may exist within a layer thickness of $5\mu$ from the substrate side or the free surface (the layer region within $5\mu$ thickness from $t_B$ or $t_T$).

In the present invention, halogen atoms (X) which may be incorporated in the light-receiving layer, if desired, may include fluorine, chlorine, bromine and iodine, particularly preferably fluorine and chlorine.

In the present invention, by incorporating a substance (C) for controlling conductivity in the light receiving layer, the conductivity characteristic of the light receiving layer can freely be controlled as desired.

As a substance (C) for controlling conductivity characteristics, there may be mentioned so called impurities in the field of semiconductors. In the present invention, there may be included p-type impurities giving p-type conductivity characteristics and n-type impurities giving n-type conductivity characteristics to a-SiGe(H,X) constituting the light receiving layer formed.

More specifically, there may be mentioned as p-type impurities atoms belonging to the group III of the periodic table (Group III atoms), such as B (boron), Al (aluminum), Ga (gallium), In (indium), Tl (thallium), etc., particularly preferably B and Ga.

As n-type impurities, there may be included the atoms belonging to the group V of the periodic table, such as P (phosphorus), As (arsenic), Sb (antimony), Bi (bismuth), etc., particularly preferably P and As.

In the present invention, the content of the substance (C) for controlling conductivity in the light receiving layer may be suitably be selected depending on the conductivity required for said light receiving layer, or the organic relationships such as relation with the characteristics of said light receiving layer at the contacted interface with the substrate.

Also, when the above substance (C) for controlling conductivity is contained in the light receiving layer locally in a desired layer region in said light receiving layer, especially in the end portion layer region on the substrate side of the light receiving layer, the content of the substance (C) for controlling conductivity is determined suitably with due considerations of the relationships with characteristics of other layer regions provided in direct contact with said layer region or the characteristics at the contacted interface with said other layer regions.

In the present invention, the content of the subtance (C) for controlling conductivity contained in the light receiving layer should preferably be 0.01 to $5 \times 10^4$ atomic ppm, more preferably 0.5 to $1 \times 10^4$ atomic ppm, most preferably $1-5 \times 10^3$ atomic ppm.

In the present invention, when the content of said substance (C) in the layer region containing said substance is 30 atomic ppm or more, more preferably 50 atomic ppm or more, most preferably 100 atomic ppm or more, the above substance (C) should desirably be contained locally in a part of the layer region in the light receiving layer, especially localized in the end portion layer region on the substrate side of the light receiving layer.

Among the above cases, by incorporating the substance (C) for controlling conductivity in the end portion layer region (E) on the substrate side of the light receiving layer in an amount of the value as mentioned above or more, in the case, for example, when said substance (C) to be incorporated is a p-type impurity as mentioned above, migration of electrons injected from the substrate side into the light receiving layer can be effectively inhibited when the free surface of the light receiving layer is subjected to the charging treatment to $\oplus$ polarity. On the other hand, when the substance to be incorporated is a n-type impurity, migration of positive holes injected from the substrate side into the light receiving layer can be effectively inhibited when the free surface of the light receiving layer is subjected to the charging treatment to $\ominus$ polarity.

In the case as mentioned above, when a substance for controlling conductivity of one polarity is contained in the end portion layer region (E), the layer region (Z) at the portion excluding the above end portion layer region (E) may contain a substance for controlling conductivity of the other polarity, or a substance for controlling conductivity of the same polarity may be contained therein in an amount by far smaller than that practically contained in the end portion layer region (E).

In such a case, the content of the substance (C) for controlling conductivity contained in the above layer region (Z) can be determined adequately as desired depending on the polarity or the content of the substance contained in the end portion layer region (E), but it is preferably 0.001 to 1000 atomic ppm, more preferably 0.05 to 500 atomic ppm, most preferably 0.1 to 200 atomic ppm.

In the present invention, when the same kind of a substance for controlling conductivity is contained in the end portion layer region (E) and the layer region (Z), the content in the layer region (Z) should preferably be 30 atomic ppm or less. As different from the cases as mentioned above, in the present invention, it is also possible to provide a layer region containing a substance for controlling conductivity having one polarity and a layer region containing a substance for controlling conductivity having the other polarity in direct contact with each other, thus providing a so called depletion layer at said contact region. In short, for example, a layer containing the aforesaid p-type impurity and a layer region containing the aforesaid n-type impurity are provided in the light receiving layer in direct contact with each other to form the so called p-n junction, whereby a depletion layer can be provided.

In the present invention, formation of the light receiving layer constituted of a-SiGe(H,X) may be conducted according to the vacuum deposition method utilizing discharging phenomenon, such as glow discharge method, sputtering method or ion-plating method. For example, for formation of the light receiving layer constituted of a-SiGe(H,X) according to the glow discharge method, the basic procedure comprises introducing, a starting gas for Si supply capable of supplying silicon atoms (Si), a starting gas for Ge supply capable of supplying germanium atoms (Ge) together with, if desired, a starting gas for introduction of hydrogen atoms (H) and/or a starting gas for introduction of halogen atoms (X) into a deposition chamber which can be internally brought to a reduced pressure, and exciting glow discharge in said deposition chamber, thereby effecting formation of a layer consisting of a-SiGe(H,X) on the surface of a substrate placed at a predetermined position. For distributing ununiformly the germanium atoms, a layer consisting of a-SiGe(H,X) may be formed while controlling the depth profile of germanium atoms according to a desired change rate curve. Alternatively, for formation according to the sputtering method, when carrying out sputtering by use of a target constituted of Si or two sheets of targets of said target and a target constituted of Ge, or a target of a mixture of Si and Ge in an atmosphere of an inert gas such as Ar, He, etc. or a gas mixture based on these gases, a starting gas for Ge supply optionally diluted with He, Ar, etc., optionally together with, if desired, a gas for introduction of hydrogen atoms (H) and/or a gas for introduction of halogen atoms (X) may be introduced into a deposition chamber for sputtering, thereby forming a plasma atmosphere of a desired gas, and sputtering of the aforesaid target may be effected, while controlling the gas flow rate of the starting gas for supply of Ge according to a desired change rate curve.

In the case of the ion-plating method, for example, a vaporizing source such as a polycrystalline silicon or a single crystalline silicon and a polycrystalline germanium or a single crystalline germanium may be placed as vaporizing source in an evaporating boat, and the vaporizing source is heated by the resistance heating method or the electron beam method (EB method) to be vaporized, and the flying vaporized product is permitted to pass through a desired gas plasma atmosphere, otherwise following the same procedure as in the case of sputtering.

The starting gas for supplying Si to be used in the present invention may include gaseous or gasifiable hydrogenated silicons (silanes) such as $SiH_4$, $Si_2H_6$, $Si_3H_8$, $Si_4H_{10}$ and others as effective materials. In particular, $SiH_4$ and $Si_2H_6$ are preferred with respect to easy handling during layer formation and efficiency for supplying Si.

As the substances which can be starting gases for Ge supply, there may be effectively employed gaseous or gasifiable hydrogenated germanium such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, $Ge_9H_{20}$, etc. In particular, $GeH_4$, $Ge_2H_6$ and $Ge_3H_8$ are preferred with respect to easy handling during layer formation and efficiency for supplying Ge.

Effective starting gases for introduction of halogen atoms to be used in the present invention may include a large number of halogenic compounds, as exemplified preferably by gaseous or gasifiable halogenic compounds such as halogenic gases, halides, interhalogen compounds, silane derivatives substituted with halogens, and the like.

Further, there may also be included gaseous or gasifiable silicon compounds containing halogen atoms constituted of silicon atoms and halogen atoms as constituent elements as effective ones in the present invention.

Typical examples of halogen compounds preferably used in the present invention may include halogen gases such as of fluorine, chlorine, bromine or iodine, interhalogen compounds such as $BrF$, $ClF$, $ClF_3$, $BrF_5$, $BrF_3$, $IF_3$, $IF_7$, $ICl$, $IBr$, etc.

As the silicon compounds containing halogen atoms, namely so called silane derivatives substituted with halogens, there may preferably be employed silicon halides such as $SiF_4$, $Si_2F_6$, $SiCl_4$, $SiBr_4$ and the like.

When the characteristic photoconductive member of the present invention is formed according to the glow discharge method by employment of such a silicon compound containing halogen atoms, it is possible to form the light receiving layer comprising a-SiGe containing halogen atoms on a desired substrate without use of a hydrogenated silicon gas as the starting gas capable of supplying Si together with the starting gas for Ge supply.

In the case of forming the light receiving layer containing halogen atoms according to the glow discharge method, the basic procedure comprises introducing, for example, a silicon halide as the starting gas for Si supply, a hydrogenated germanium as the starting gas for Ge supply and a gas such as Ar, $H_2$, He, etc. at a predetermined mixing ratio into the deposition chamber for formation of the light receiving layer and exciting glow discharge to form a plasma atmosphere of these gases, whereby the light receiving layer can be formed on a desired substrate. In order to control the ratio of hydrogen atoms incorporated more easily, hydrogen gas or a gas of a silicon compound containing hydrogen atoms may also be mixed with these gases in a desired amount to form the layer.

Also, each gas is not restricted to a single species, but multiple species may be available at any desired ratio.

In either case of the sputtering method and the ion-plating method, introduction of halogen atoms into the layer formed may be performed by introducing the gas of the above halogen compound or the above silicon compound containing halogen atoms into a deposition chamber and forming a plasma atmosphere of said gas.

On the other hand, for introduction of hydrogen atoms, a starting gas for introduction of hydrogen atoms, for example, $H_2$ or gases such as silanes and/or hydrogenated germanium as mentioned above, may be introduced into a deposition chamber for sputtering, followed by formation of the plasma atmosphere of said gases.

In the present invention, as the starting gas for introduction of halogen atoms, the halides or halo-containing silicon compounds as mentioned above can effectively be used. Otherwise, it is also possible to use effectively as the starting material for formation of the light receiving layer gaseous or gasifiable substances, including halides containing hydrogen atom as one of the constituents, e.g. hydrogen halide such as HF, HCl, HBr, HI, etc.; halo-substituted hydrogenated silicon such as $SiH_2F_2$, $SiH_2I_2$, $SiH_2Cl_2$, $SiHCl_3$, $SiH_2Br_2$, $SiHBr_3$, etc.; hydrogenated germanium halides such as $GeHF_3$, $GeH_2F_2$, $GeH_3F$, $GeHCl_3$, $GeH_2Cl_2$, $GeH_3Cl$, $GeHBr_3$, $GeH_2Br_2$, $GeH_3Br$, $GeHI_3$, $GeH_2I_2$, $GeH_3I$, etc.; germanium halides such as $GeF_4$, $GeCl_4$, $GeBr_4$, $GeI_4$, $GeF_2$, $GeCl_2$, $GeBr_2$, $GeI_2$, etc.

Among these substances, halides containing hydrogen atoms can preferably be used as the starting material for introduction of halogen atoms, because hydrogen atoms, which are very effective for controlling electrical or photoelectric characteristics, can be introduced into the layer simultaneously with introduction of halogen atoms during formation of the light receiving layer.

For introducing hydrogen atoms structurally into the light receiving layer, other than those as mentioned above, $H_2$ or a hydrogenated silicon such as $SiH_4$, $Si_2H_6$, $Si_3H_8$, $Si_4H_{10}$, etc. together with germanium or a germanium compound for supplying Ge, or a hydrogenated germanium such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, $Ge_9H_{20}$, etc. together with silicon or a silicon compound for supplying Si can be permitted to co-exist in a deposition chamber, followed by excitation of discharging.

According to a preferred embodiment of the present invention, the amount of hydrogen atoms (H) or the amount of halogen atoms (X) or the sum of the amounts of hydrogen atoms and halogen atoms (H+X) to be contained in the light receiving layer constituting the photoconductive layer to be formed should preferably be 0.01 to 40 atomic %, more preferably 0.05 to 30 atomic %, most preferably 0.1 to 25 atomic %.

For controlling the amount of hydrogen atoms (H) and/or halogen atoms (X) to be contained in the light receiving layer, for example, the substrate temperature and/or the amount of the starting materials used for incorporation of hydrogen atoms (H) or halogen atoms (X) to be introduced into the deposition device system, discharging power, etc. may be controlled.

In the present invention, for provision of the layer region (N) containing nitrogen atoms in the light receiving layer, a starting material for introduction of nitrogen atoms may be used together with the starting material for formation of the light receiving layer as mentioned above during formation of the light receiving layer and may be incorporated in the layer formed while controlling their amounts.

When the glow discharge method is to be employed for formation of the layer region (N), the starting material as the starting gas for formation of the layer region (N) may be constituted by adding a starting material for introduction of nitrogen atoms to the starting material selected as desired from those for formation of the light receiving layer as mentioned above. At such a starting material for introduction of nitrogen atoms, there may be employed most of gaseous or gasifiable substances containing at least nitrogen atoms as constituent atoms.

The starting material effectively used as the starting gas for introduction of nitrogen atoms (N) to be used during formation of the layer region (N), it is possible to use compounds containing N as constituent atom or compounds containing N and H as constituent atoms, such as gaseous or gasifiable nitrogen compounds, nitrides and azides, including for example, nitrogen ($N_2$), ammonia ($NH_3$), hydrazine ($H_2NNH_2$), hydrogen azide ($HN_3$), ammonium azide ($NH_4N_3$) and so on. Alternatively, for the advantage of introducing halogen atoms (X) in addition to nitrogen atoms (N), there may be also employed nitrogen halide compounds such as nitrogen trifluoride ($F_3N$), dinitrogen tetrafluoride ($F_4N_2$) and the like.

In the present invention, for further promoting the effect obtained by nitrogen atoms, it is possible to incorporate oxygen atoms in addition to nitrogen atoms in the layer region (N). The starting gas for introduction of oxygen atoms in the layer region may include, for example, oxygen ($O_2$), ozone ($O_3$), nitrogen monooxide (NO), nitrogen dioxide ($NO_2$), dinitrogen monooxide ($N_2O$), dinitrogen trioxide ($N_2O_3$), dinitrogen tetraoxide ($N_2O_4$), dinitrogen pentaoxide ($N_2O_5$), nitrogen trioxide ($NO_3$), and lower siloxanes containing silicon atoms (Si), oxygen atoms (O) and hydrogen atoms (H) as constituent atoms such as disiloxane ($H_3SiOSiH_3$), trisiloxane ($H_3SiOSiH_2OSiH_3$), and the like.

For formation of the layer region (N) containing nitrogen atoms according to the sputtering method, a single crystalline or polycrystalline Si wafer or $Si_3N_4$ wafer or a wafer containing Si and $Si_3N_4$ mixed therein may be employed and sputtering of these wafers may be conducted in various gas atmospheres.

For example, when Si wafer is employed as the target, a starting gas for introduction of nitrogen atoms optionally together with a starting gas for introduction of hydrogen atoms and/or halogen atoms, which may optionally be diluted with a diluting gas, may be introduced into a deposition chamber for sputtering to form gas plasma of these gases, in which sputtering of the aforesaid Si wafer may be effected.

Alternatively, by use of separate targets of Si and $Si_3N_4$ or one sheet of a target containing Si and $Si_3N_4$ mixed therein, sputtering may be effected in an atmosphere of a diluting gas as a gas for sputtering or in a gas atmosphere containing at least hydrogen atoms (H) and/or halogen atoms (X) as constituent atoms. As the starting gas for introduction of nitrogen atoms, there may be employed the starting gases shown as examples in the glow discharge method previously described also as effective gases in case of sputtering.

In the present invention, when providing a layer region (N) containing nitrogen atoms during formation of the light receiving layer, formation of the layer region (N) having a desired distribution state in the direction of layer thickness (depth profile) by varying stepwise the content C(N) of nitrogen atoms contained in said layer region (N) may be conducted in case of glow discharge by introducing a starting gas for introduction of nitrogen atoms of which the content C(N) is to be varied into a deposition chamber, while varying suitably its gas flow rate according to a desired change rate curve. For example, by the manual method or any other method conventionally used such as an externally driven motor, etc., the opening of certain needle valve provided in the course of the gas flow channel system may be gradually varied. During this procedure, the rate of variation is not necessarily required to be linear, but the flow rate may be controlled according to a variation rate curve previously designed by means of, for example, a microcomputer to give a desired content curve.

In case when the layer region (N) is formed by the sputtering method, formation of a desired depth profile of nitrogen atoms in the direction of layer thickness by varying stepwise the content C(N) of nitrogen atoms in the direction of layer thickness may be performed first similarly as in case of the glow discharge method by employing a starting material for introduction of nitrogen atoms under gaseous state and varying suitably as desired the gas flow rate of said gas when introduced into the deposition chamber.

Secondly, formation of such a depth profile can also be achieved by previously changing the composition of a target for sputtering. For example, when a target comprising a mixture of Si and $Si_3N_4$ is to be used, the mixing ratio of Si to $Si_3N_4$ may be varied in the direction of layer thickness of the target.

For incorporating a substance for controlling conductivity such as the group III atoms or the group V atoms structurally into the light receiving layer, a starting material for introduction of the group III atoms or a starting material for introduction of the group V atoms may be introduced under gaseous state into a deposition chamber together with the starting materials for formation of the light receiving layer during layer formation. As the starting material which can be used for introduction of the group III atoms, it is desirable to use those which are gaseous at room temperature under atmospheric pressure or can readily be gasified at least under layer forming conditions. Typical examples of such starting materials for introduction of the group III atoms, there may be included as the compounds for introduction of boron atoms boron hydrides such as $B_2H_6$, $B_4H_{10}$, $B_5H_9$, $B_5H_{11}$, $B_6H_{10}$, $B_6H_{12}$, $B_6H_{14}$, etc. and boron halides such as $BF_3$, $BCl_3$, $BBR_3$, etc. Otherwise, it is also possible to use $AlCl_3$, $GaCl_3$, $Ga(CH_3)_3$, $InCl_3$, $TlCl_3$ and the like.

The starting materials which can effectively be used in the present invention for introduction of the group V atoms may include, for introduction of phosphorus atoms, phosphorus hydride such as $PH_3$, $P_2H_4$, etc., phosphorus halides such as $PH_4I$, $PF_3$, $PF_5$, $PCl_3$, $PCl_5$, $PBr_3$, $PBr_5$, $PI_3$ and the like. Otherwise, it is also possible to utilize $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, $BiBr_3$ and the like effectively as the starting material for introduction of the group V atoms.

In the present invention, the layer thickness of the layer region constituting the light receiving layer and containing a substance (C) for controlling conductivity provided locally on the substrate side may be suitably be determined depending on the characteristics required for said layer region and other layer regions constituting the light receiving layer provided on said layer region, but its lower limit may preferably 30 Å or more, more preferably 40 Å or more, most preferably 50 Å or more.

When the content of the substance (C) for controlling conductivity contained in the above layer region is made 30 atomic ppm or more, the upper limit of the layer thickness of said layer region may preferably be $10\mu$ or less, more preferably $8\mu$ or less, most preferably $5\mu$ or less.

The substrate to be used in the present invention may be either electroconductive material or insulating material. As the electroconductive material, there may be mentioned metals such as NiCr, stainless steel, Al, Cr, Mo, Au, Nb, Ta, V, Ti, Pt, Pd etc. or alloys thereof.

As insulating material, there may conventionally be used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, papers and so on. These insulating substrates should preferably have at least one surface subjected to electroconductive treatment, and it is desirable to provide other layers on the side at which said electroconductive treatment has been applied.

For example, electroconductive treatment of a glass can be effected by providing a thin film of NiCr, Al, Cr, Mo, Au, Ir, Nb, Ta, V, Ti, Pt, Pd, $In_2O_3$, $SnO_2$, ITO ($In_2O_3 + SnO_2$) thereon. Alternatively, a synthetic resin film such as polyester film can be subjected to the electroconductive treatment on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc. or by laminating treatment with said metal, thereby imparting electroconductivity to the surface. The substrate may be shaped in any form such as cylinders, belts, plates or others, and its form may be determined as desired. For example, when the photoconductive member 100 in FIG. 1 is to be used as an image forming member for electrophotography, it may desirably be formed into an endless belt or a cylinder for use in continuous high speed copying. The substrate may have a thickness, which is conveniently determined so that a photoconductive member as desired may be formed. When the photoconductive member is required to have a flexibility, the substrate is made as thin as possible, so far as the function of a substrate can be sufficiently exhibited. However, in such a case, the thickness is preferably $10\mu$ or more from the points of fabrication and handling of the substrate as well as its mechanical strength.

Figure 16:
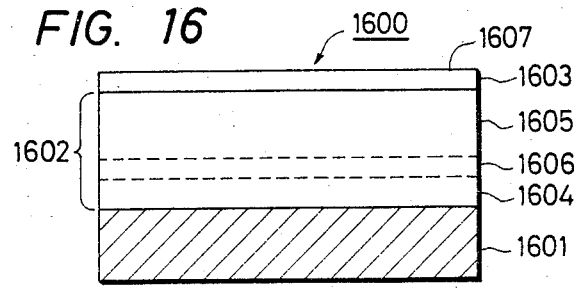

FIG. 16 shows a schematic illustration for explanation of the layer structure of the second preferred embodiment of the photoconductive member of the present invention.

The photoconductive member 1600 shown in FIG. 16 has a substrate 1601 for photoconductive member, and a first layer (I) 1602 consisting of a-SiGe(H,X), containing nitrogen atoms and having photoconductivity, and a second layer (II) 1603.

In the case of the photoconductive member 1600 shown in FIG. 16, the light receiving layer is constituted of the first layer (I) 1602 and the second layer (II) 1603. The photoconductive member 1600 shown in FIG. 16 has the same layer structure as the photoconductive member 100 shown in FIG. 1 except for having the second layer (II) 1603, and all the explanations made for the photoconductive member 100 are applicable for the photoconductive member 1600.

Thus, the first layer (I) 1602 corresponds to the light receiving layer 102, having the same layer structure as the light receiving layer 102, namely the first layer (I) 1602 containing nitrogen atoms, having a first layer region (I) 1604 with nitrogen atom content of C(1), a second layer region (2) 1605 with nitrogen atom content of C(2) and a third layer region (3) 1606 with nitrogen atom content of C(3).

The second layer (II) has a free surface 1607.

In the photoconductive member 1600 shown in FIG. 16, the second layer (II) 1603 formed on the first layer (I) 1602 has a free surface, which is provided for accomplishing the objects of the present invention primarily in humidity resistance, continuous repeated use characteristic, dielectric strength, use environment characteristic and durability.

In the case of the photoconductive member 1600 shown in FIG. 16, since the respective amorphous materials constituting the first layer (I) 1602 and the second layer (II) 1603 contain the common constituent atom of silicon, chemical stability is ensured at the laminated interface therebetween.

The second layer (II) 1603 in the photoconductive member 1600 shown in FIG. 16 is constituted of an amorphous material containing silicon atoms (Si) and at least one of carbon atoms (C) and oxygen atoms (O), optionally together with at least one of hydrogen atoms (H) and halogen atoms (X).

The above amorphous material constituting the second layer (II) may include an amorphous material containing silicon atoms (Si) and carbon atoms (C), optionally together with hydrogen atoms (H) and/or halogen atoms (X) [hereinafter written as "a-$(Si_xC_{1-x})_y(H,X)_{1-y}$", wherein $0<x$, $y<1$] and an amorphous material containing silicon atoms (Si) and oxygen atoms (O), optionally together with hydrogen atoms (H) and/or halogen atoms (X) [hereinafter written as "a-$(Si_xO_{1-x})_y(H,X)_{1-y}$", wherein $0<x$, $y<1$].

Formation of the second amorphous layer (II) may be performed according to the glow discharge method, the sputtering method, the ion implantation method, the ion plating method, the electron beam method, etc. These preparation methods may be suitably selected depending on various factors such as the preparation conditions, the extent of the load for capital investment for installations, the production scale, the desirable characteristics required for the photoconductive member to be prepared, etc. For the advantages of relatively easy control of the preparation conditions for preparing photoconductive members having desired characteristics and easy introduction of carbon atoms and halogen atoms with silicon atoms into the second amorphous layer (II) to be prepared, there may preferably be employed the glow discharge method or the sputtering method.

Further, in the present invention, the glow discharge method and the sputtering method may be used in combination in the same device system to form the second layer (II).

For formation of the second layer (II) according to the glow discharge method, starting gases for formation of the second layer (II), which may optionally be mixed with a diluting gas at a predetermined mixing ratio, may be introduced into a deposition chamber for vacuum deposition in which a substrate is placed, and glow discharge is excited in said deposition chamber to form the gases introduced into a gas plasma, thereby depositing an amorphous material constituting the second layer (II) on the first layer (I) already formed on the substrate.

In the present invention, the starting gases which can be effectively used for formation of the second layer (II) may include gaseous or readily gasifiable substances at normal temperature and normal pressure.

In the present invention, as starting gases for formation of a-$(Si_xC_{1-x})_y(H,X)_{1-y}$, there may be employed most of substances containing at least one of silicon atoms (Si), carbon atoms (C), hydrogen atoms (H) and halogen atoms (X) as constituent atoms which are gaseous or gasified substances of readily gasifiable ones.

For example, it is possible to use a mixture of a starting gas containing Si as constituent atom, a starting gas containing C as constituent atom and optionally a starting gas containing H as constituent atom and/or a starting gas containing X as constituent atom at a desired mixing ratio, or a mixture of a starting gas containing Si as constituent atom and a starting gas containing C and H as constituent atoms and/or a starting gas containing X as constituent atoms also at a desired ratio, or a mixture of a starting gas containing Si as constituent atom and a starting gas containing three constituent atoms of Si, C and H or a starting gas containing three constituent atoms of Si, C and X.

Alternatively, it is also possible to use a mixture of a starting gas containing Si and H as constituent atoms with a starting gas containing C as constituent atom or a mixture of a starting gas containing Si and X as constituent atoms and a starting gas containing C as constituent atom.

In the present invention, as starting gases for formation of a-$(Si_xO_{1-x})_y(H,X)_{1-y}$, there may be employed most of substances containing at least one of silicon atoms (Si), oxygen atoms (O), hydrogen atoms (H) and halogen atoms (X) as constituent atoms which are gaseous or gasified substances of readily gasifiable ones.

For example, it is possible to use a mixture of a starting gas containing Si as constituent atom, a starting gas containing O as constituent atom and optionally a starting gas containing H as constituent atom and/or a starting gas containing X as constituent atom at a desired mixing ratio, or a mixture of a starting gas containing Si as constituent atom and a starting gas containing O and H as constituent atoms and/or a starting gas containing O and X as constituent atoms also at a desired ratio, or a mixture of a starting gas containing Si as constituent atom and a starting gas containing three constituent atoms of Si, O and H or a starting gas containing three constituent atoms of Si, O and X.

Alternatively, it is also possible to use a mixture of a starting gas containing Si and H as constituent atoms with a starting gas containing O as constituent atom or a mixture of a starting gas containing Si and X as constituent atoms and a starting gas containing O as constituent atom.

The starting gas to be used effectively for formation of the second layer (II) in the present invention may include hydrogenated silicons containing Si and H as constituent atoms (silanes) such as $SiH_4$, $Si_2H_6$, $Si_3H_8$, $Si_4H_{10}$ and others, compounds containing C and H as constituent atoms such as saturated hydrocarbons containing 1 to 4 carbon atoms, ethylenic hydrocarbons having 2 to 4 carbon atoms, acetylenic hydrocarbons having 2 to 3 carbons atoms, single substances and compounds containing O as constituent atom or N and O as constituent atoms, single substances of halogen, hydrogen halides, interhalogen compounds, silicon halides, halo-substituted hydrogenated silicons, etc.

More specifically, there may be included, as saturated hydrocarbons, methane ($CH_4$), ethane ($C_2H_6$), propane ($C_3H_8$), n-butane (n-$C_4H_{10}$), pentane ($C_5H_{12}$); as ethylenic hydrocarbons, ethylene ($C_2H_4$), propylene ($C_3H_6$), butene-1 ($C_4H_8$), butene-2 ($C_4H_8$), isobutylene ($C_4H_8$), pentene ($C_5H_{10}$); as acetylenic hydrocarbons, acetylene ($C_2H_2$), methyl acetylene ($C_3H_4$), butyne ($C_4H_6$); as single substances of halogen, fluorine, chlorine, bromine, iodine; as hydrogen halides, HF, HI, HCl, HBr; as interhalogen compounds, BrF, ClF, $ClF_3$, $ClF_5$, $BrF_5$, $BrF_3$, $IF_7$, $IF_5$, ICl, IBr, etc.; as silicon halides $SiF_4$, $Si_2F_6$, $SiCl_4$, $SiCl_3Br$, $SiCl_2Br_2$, $SiClBr_3$, $SiCl_3I$, $SiBr_4$, etc.; as halo-substituted hydrogenated silicon, $SiH_2F_2$, $SiH_2Cl_2$, $SiHCl_3$, $SiH_3Cl$, $SiH_3Br$, $SiH_2Br_2$, $SiHBr_3$, etc.

Single substances or compounds containing O as constituent atoms may include, for example, oxygen ($O_2$), ozone ($O_3$), nitrogen monooxide (NO), nitrogen dioxide ($NO_2$), dinitrogen monooxide ($N_2O$), dinitrogen trioxide ($N_2O_3$), dinitrogen tetraoxide ($N_2O_4$), dinitrogen pentaoxide ($N_2O_5$), nitrogen trioxide ($NO_3$), and lower siloxanes containing silicon atoms (Si), oxygen atoms (O) and hydrogen atoms (H) as constituent atoms such as disiloxane ($H_3SiOSiH_3$), trisiloxane ($H_3SiOSiH_2OSiH_3$), and the like.

Otherwise, it is also possible to use halo-substituted paraffinic hydrocarbons such as $CF_4$, $CCl_4$, $CBr_4$, $CHF_3$, $CH_2F_2$, $CH_3F$, $CH_3Cl$, $CH_3Br$, $CH_3I$, $C_2H_5Cl$, etc.; fluorinated sulfur compounds such as $SF_4$, $SF_6$, etc.; silane derivatives, including alkyl silanes such as $Si(CH_3)_4$, $Si(C_2H_5)_4$, etc. and halo-containing alkyl silanes such as $SiCl(CH_3)_3$, $SiCl_2(CH_3)_2$, $SiCl_3CH_3$, etc. as effective ones.

The starting materials for formation of the above second layer (II) may be selected and employed as desired in formation of the second layer (II) so that silicon atoms, at least one of carbon atoms and oxygen atoms, together with at least one of hydrogen atoms and halogen atoms may be contained at a predetermined composition ratio in the second layer (II) to be formed.

For example, $Si(CH_3)_4$ as the material capable of incorporating easily silicon atoms, carbon atoms and hydrogen atoms and forming easily a layer having desired characteristics and $SiHCl_3$, $SiCl_4$, $SiH_2Cl_2$ or $SiH_3Cl$ as the material for incorporating halogen atoms may be mixed at a predetermined mixing ratio and introduced under gaseous state into a device for formation of a second layer (II), followed by excitation of glow discharge, whereby there can be formed a second layer (II) comprising a-$(Si_xC_{1-x})_y(Cl+H)_{1-y}$.

For formation of the second layer (II) according to the sputtering method, a single crystalline or polycrystalline Si wafer, C wafer or $SiO_2$ wafer or a wafer containing Si and C and/or $SiO_2$ mixed therein may be employed and sputtering of these wafers may be conducted in various gas atmospheres containing optionally halogen atoms and/or hydrogen atoms.

For example, when Si wafer is employed as the target, a starting gas for introduction of C and/or O optionally together with a starting gas for introduction of H and/or X, which may optionally be diluted with a diluting gas, may be introduced into a deposition chamber for sputtering to form gas plasma of these gases, in which sputtering of the aforesaid Si wafer may be effected.

Alternatively, by use of separate targets of Si and C and/or $SiO_2$ or one sheet of a target containing Si and C and/or $SiO_2$ mixed therein, sputtering may be effected in a gas atmosphere containing optionally hydrogen atoms (H) and/or halogen atoms (X) as constituent atoms. As the starting gas for introduction of C, O, H and X, there may be employed the starting gases shown as examples in the glow discharge method previously described also as effective gases in case of sputtering.

In the present invention, as the diluting gas to be used in formation of the second layer (II) by the glow discharge method or the sputtering method, there may be included the so called rare gases such as He, Ne and Ar as preferable ones.

The second layer (II) in the present invention should be carefully formed so that the required characteristics may be given exactly as desired.

That is, the above material containing Si, and C and/or O, optionally together with H and/or X as constituent atoms can take various forms from crystalline to amorphous and show electrical properties from conductive through semi-conductive to insulating and photoconductive properties from photoconductive to non-photoconductive depending on the preparation conditions. Therefore, in the present invention, the preparation conditions are strictly selected as desired so that there may be formed the amorphous material for constitution of the second layer (II) having desired characteristics depending on the purpose. For example, when the second layer (II) is to be provided primarily for the purpose of improvement of dielectric strength, the aforesaid a-$(Si_xC_{1-x})_y(H,X)_{1-y}$ and a-$(Si_xO_{1-x})_y(H,X)_{1-y}$ are prepared as an amorphous material having marked electric insulating behaviours under the use environment.

Alternatively, when the primary purpose for provision of the second layer (II) is improvement of continuous repeated use characteristics or environmental use characteristics, the degree of the above electric insulating property may be alleviated to some extent and the aforesaid a-$(Si_xO_{1-x})_y(H,X)_{1-y}$ may be prepared as an amorphous material having sensitivity to some extent to the light irradiated.

In forming the second layer (II) on the surface of the first layer (I), the substrate temperature during layer formation is an important factor having influences on the structure and the characteristics of the layer to be formed, and it is desired in the present invention to control severely the substrate temperature during layer formation so that the second layer (II) having intended characteristics may be prepared as desired.

As the substrate temperature in forming the second layer (II) for accomplishing effectively the objects in the present invention, there may be selected suitably the optimum temperature range in conformity with the method for forming the second layer (II) in carrying out formation of the second layer (II), preferably 20° to 400° C., more preferably 50° to 350° C., most preferably 100° to 300° C. For formation of the second layer (II), the glow discharge method or the sputtering method may be advantageously adopted, because severe control of the composition ratio of atoms constituting the layer or control of layer thickness can be conducted with relative ease as compared with other methods. In case when the second layer (II) is to be formed according to these layer forming methods, the discharging power during layer formation is one of important factors influencing the characteristics of a-$(Si_xC_{1-x})_y(H,X)_{1-y}$ and a-$(Si_xO_{1-x})_y(H,X)_{1-y}$ to be prepared, similarly as the aforesaid substrate temperature.

The discharging power condition for preparing effectively a-$(Si_xC_{1-x})_y(H,X)_{1-y}$ and a-$(Si_xO_{1-x})_y(H,X)_{1-y}$ having characteristics for accomplishing the objects of the present invention with good productivity may preferably be 10 to 300 W, more preferably 20 to 250 W, most preferably 50 to 200 W.

The gas pressure in a deposition chamber may preferably be 0.01 to 1 Torr, more preferably 0.1 to 0.5 Torr.

In the present invention, the above numerical ranges may be mentioned as preferable numerical ranges for the substrate temperature, discharging power for preparation of the second layer (II). However, these factors for layer formation should not be determined separately independently of each other, but it is desirable that the optimum values of respective layer forming factors should be determined based on mutual organic relationships so that the second layer (II) having desired characteristics may be formed.

The respective contents of carbon atoms and/or oxygen atoms in the second layer (II) in the photoconductive member of the present invention are important factors for obtaining the desired characteristics to accomplish the objects of the present invention, similarly as the conditions for preparation of the second layer (II). The respective contents of carbon atoms and/or oxygen atoms contained in the second layer (II) in the present invention are determined as desired depending on the amorphous material constituting the second layer (II) and its characteristics.

More specifically, the amorphous material represented by the above formula a-$(Si_xC_{1-x})_y(H,X)_{1-y}$ may be broadly classified into an amorphous material constituted of silicon atoms and carbon atoms (hereinafter written as "a-$Si_aC_{1-a}$", where $0<a<1$), an amorphous material constituted of silicon atoms, carbon atoms and hydrogen atoms (hereinafter written as a-$(Si_bC_{1-b})_cH_{1-c}$, where $0<b$, $c<1$) and an amorphous material constituted of silicon atoms, carbon atoms, halogen atoms and optionally hydrogen atoms (hereinafter written as "a-$(Si_dC_{1-d})_e(X,H)_{1-e}$", where $0<d$, $e<1$).

In the present invention, when the second layer (II) is to be constituted of a-$Si_aC_{1-a}$, the content of carbon atoms in the second layer (II) may generally be $1\times10^{-3}$ to 90 atomic %, more preferably to 80 atomic %, most preferably 10 to 75 atomic %, namely in terms of representation by a in the above a-$Si_aC_{1-a}$, a being preferably 0.1 to 0.99999, more preferably 0.2 to 0.99, most preferably 0.25 to 0.9.

In the present invention, when the second layer (II) is to be constituted of a-$(Si_bC_{1-b})_cH_{1-c}$, the content of carbon atoms in the second layer (II) may preferably be $1\times10^{-3}$ to 90 atomic %, more preferably 1 to 90 atomic %, most preferably 10 to 85 atomic %, the content of hydrogen atoms preferably 1 to 40 atomic %, more preferably 2 to 35 atomic %, most preferably 5 to 30 atomic %, and the photoconductive member formed when the hydrogen content is within these ranges can be sufficiently applicable as excellent one in practical aspect.

That is, in terms of the representation by the above a-$(Si_bC_{1-b})_cH_{1-c}$, b should preferably be 0.1 to 0.99999, more preferably 0.1 to 0.99, most preferably 0.15 to 0.9, and c preferably 0.6 to 0.99, more preferably 0.65 to 0.98, most preferably 0.7 to 0.95.

When the second layer (II) to be constituted of a-$(Si_dC_{1-d})_e(X,H)_{1-e}$, the content of carbon atoms in the second layer (II) may preferably be $1\times10^{-3}$ to 90 atomic %, more preferably 1 to 90 atomic %, most preferably 10 to 85 atomic %, the content of halogen atoms preferably 1 to 20 atomic %, more preferably 1 to 18 atomic %, most preferably 2 to 15 atomic %. When the content of halogen atoms is within these ranges, the photoconductive member prepared is sufficiently applicable in practical aspect. The content of hydrogen atoms optionally contained may preferably be 19 atomic % or less, more preferably 13 atomic % or less.

That is in terms of representation by d and e in the above a-$(Si_dC_{1-d})_e(H,X)_{1-e}$, d should preferably be 0.1 to 0.99999, more preferably 0.1 to 0.99, most preferably 0.15 to 0.9, and e preferably 0.8 to 0.99, more preferably 0.82 to 0.99, most preferably 0.85 to 0.98.

On the other hand, the amorphous material represented by the above formula a-$(Si_xO_{1-x})_y(H,X)_{1-y}$ may be broadly classified into an amorphous material constituted of silicon atoms and oxygen atoms (hereinafter written as "a-$Si_aO_{1-a}$", where $0<a<1$), an amorphous material constituted of silicon atoms, oxygen atoms and hydrogen atoms (hereinafter written as a-$(Si_bO_{1-b})_cH_{1-c}$, where $0<b$, $c<1$) and an amorphous material constituted of silicon atoms, oxygen atoms, halogen atoms and optionally hydrogen atoms (hereinafter written as "a-$(Si_dO_{1-d})_e(X,H)_{1-e}$", where $0<d$, $e<1$).

In the present invention, when the second layer (II) is to be constituted of a-$Si_aO_{1-a}$, the content of oxygen atoms in the second layer (II) may preferably be 0.33 to 0.99999, more preferably 0.5 to 0.99, most preferably 0.6 to 0.9, in terms of a in the above formula a-$Si_aO_{1-a}$.

In the present invention, when the second layer (II) is to be constituted of a-$(Si_bO_{1-b})_cH_{1-c}$, the content of oxygen atoms may preferably be such that b in the above formula a-$(Si_bO_{1-b})_cH_{1-c}$ may be preferably to 0.33 to 0.99999, more preferably be 0.5 to 0.99, most preferably 0.6 to 0.9, and c preferably 0.6 to 0.99, more preferably 0.65 to 0.98, most preferably 0.7 to 0.95.

When the second layer (II) is to be constituted of a-$(Si_dO_{1-d})_e(X,H)_{1-e}$, the content of oxygen atoms may preferably be such that d in the above formula a-$(Si_dO_{1-d})_e(H,X)_{1-e}$ may preferably be 0.33 to 0.99999, more preferably be 0.5 to 0.99, most preferably 0.6 to 0.9, and e preferably 0.8 to 0.99, more preferably 0.82 to 0.99, most preferably 0.85 to 0.98.

The range of the numerical value of layer thickness of the second layer (II) should desirably be determined depending on the intended purpose so as to effectively accomplish the objects of the present invention.

The layer thickness of the second layer (II) is also required to be determined as desired suitably with due considerations about the relationships with the contents of oxygen atoms, the relationship with the layer thickness of the first layer (I), as well as other organic relationships with the characteristics required for respective layer regions.

In addition, it is also desirable to have considerations from economical point of view such as productivity or capability of bulk production.

The second layer (II) in the present invention is desired to have a layer thickness preferably of 0.003 to 30μ, more preferably 0.004 to 20μ, most preferably 0.005 to 10μ.

In the present invention, suitable halogen atoms (X) contained in the second layer are F, Cl, Br and I, particularly preferably F and Cl.

Figure 17:
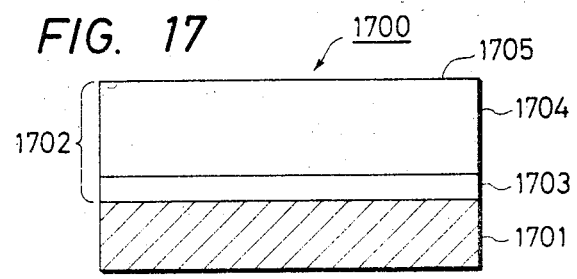

FIG. 17 shows a schematic sectional view for illustration of the layer structure of a third embodiment of the constitution of the photoconductive member of this invention.

The photoconductive member 1700 as shown in FIG. 17 has a light receiving layer 1702 formed on a substrate 1701 for photoconductive member, said light receiving layer 1702 having a free surface 1705 on one end surface.

The light receiving layer 1702 has a layer structure constituted of a first layer region (G) 1703 consisting of a-Ge(Si,H,X) and a second layer region (S) 1704 having photoconductivity consisting of a-Si(H,X) laminated successively from the substrate side 1701.

The germanium atoms contained in the first layer region (G) 1703, when contained together with other atoms in the first layer region (G) 1703, may be contained in said first layer region (G) 1703 so that they are distributed evenly throughout the first layer region (G) 1703 or contained everywhere in the layer region (G) 1703 but in ununiform content in the layer thickness direction. However, in either case, it is required for uniformizing the characteristics in the interplanar direction that the germanium atoms should be contained throughout the plane in parallel to the surface of the substrate in a uniform distribution. In particular, it is desirable that they should be distributed continuously in the layer thickness direction in the layer region (G) 1703 and more enriched on the substrate side 1701 than on the side opposite to the side where the substrate 1701 is provided (the free surface side 1705 of the light receiving layer 1702), or alternatively in a distribution contrary thereto.

In the photoconductive member shown in FIG. 17, when the distribution of germanium atoms contained in the layer region (G) 1703 is ununiform, it is desirable that they should take such a distribution as mentioned above in the layer thickness direction, while a uniform distribution within the plane parallel to the surface of the substrate.

In the layer region (S) 1704 provided on the layer region (G) 1703, no germanium atom is contained, and by forming the light receiving layer 1702 to such a layer structure, it is possible to give a photoconductive member which is excellent in photosensitivity to the light over the entire wavelength region from relatively shorter wavelength to relatively longer wavelength including the visible light region.

Also, in a preferred embodiment in the case of a system where germanium atoms are ununiformly distributed, since the distribution of germanium atoms in the layer region (G) 1703 is varied such that germanium atoms are distributed continuously over all the layer region with the content C of germanium atoms in the layer thickness direction being reduced from the substrate side to the layer region (S) 1704, affinity between the layer region (G) 1703 and the layer region (S) 1704 is excellent. Also, as described hereinafter, by increasing the content C of germanium atoms at the end portion on the substrate side extremely great, the light on the longer wavelength side which cannot substantially be absorbed by the layer region (S) 1704 can be absorbed in the layer region (G) 1703 substantially completely, when employing a semiconductor laser, whereby interference by reflection from the substrate surface can be prevented.

When silicon atoms are contained in the layer region (G) 1703, the respective amorphous materials constituting the layer region (G) 1703 and the layer region (S) 1704 have the common constituent of silicon atoms, and therefore chemical stability can be sufficiently ensured at the laminated interface.

In the case when the germanium atoms contained in the layer region (G) 1703 of the photoconductive member 1700 shown in FIG. 17 are distributed ununiformly, typical examples of depth profiles of germanium atoms in the layer thickness direction are shown in FIGS. 2 through 10 similarly as in the case of the photoconductive member 100 as shown in FIG. 1.

However, in explanation of the photoconductive member 1700 shown in FIG. 17, in FIGS. 2 through 10, the ordinate indicates the layer thickness of the layer region (G) 1703, $t_B$ showing the position of the end surface of the layer region (G) 1703 on the substrate side and $t_T$ the position of the end surface of the layer region (G) 1703 on the side opposite to the substrate side. That is, layer formation of the layer region (G) 1703 containing germanium atoms proceeds from the $t_B$ side toward the $t_T$ side.

In the photoconductive member 1700 shown in FIG. 17, the content of germanium atoms in the layer region (G) 1703, which may suitably be determined as desired so as to achieve effectively the objects of the present invention, may preferably be 1 to $10 \times 10^5$ atomic ppm, more preferably 100 to $9.5 \times 10^5$ atomic ppm, most preferably 500 to $8 \times 10^5$ atomic ppm, based on the sum with silicon atoms.

The layer thickness of the layer region (G) 1703 and the layer thickness of the layer region (S) 1704 are one of important factors for accomplishing effectively the object of the present invention and therefore sufficient care should be paid in designing of the photoconductive member so that desirable characteristics may be imparted to the photoconductive member formed.

In the present invention, the layer thickness $T_B$ of the layer region (G) 1703 may preferably be 30 Å to 50μ, more preferably 40 Å to 40μ, most preferably 50μ to 30μ.

On the other hand, the layer thickness T of the layer region (S) may be preferably 0.5 to 90μ, more preferably 1 to 80μ, most preferably 2 to 50μ.

The sum of the above layer thickness $T_B$ and T, namely ($T_B$+T) may be suitably determined as desired in designing of the layers of the photoconductive member 1700, based on the mutual organic relationship between the characteristics required for both layer regions and the characteristics required for the whole light receiving layer 1702.

In the photoconductive member shown in FIG. 17, the numerical range for the above ($T_B$+T) may generally be from 1 to 100μ, preferably 1 to 80μ, most preferably 2 to 50μ.

In a more preferred embodiment of the present invention, it is preferred to select the numerical values for respective thicknesses $T_B$ and T as mentioned above so that the relation of $T_B/T \leq 1$ may be satisfied.

In selection of the numerical values for the thicknesses $T_B$ and T in the above case, the values of $T_B$ and T should preferably be determined so that the relation $T_B/T \leq 0.9$, most preferably, $T_B/T \leq 0.8$, may be satisfied.

In the present invention, when the content of germanium atoms in the layer region (G) 1703 is $1 \times 10^5$ atomic ppm or more, the layer thickness $T_B$ of the layer region (G) should desirably be made as thin as possible, preferably 30μ or less, more preferably 25μ or less, most preferably 20μ or less.

In the present invention, illustrative of halogen atoms (X), which may optionally be incorporated in the layer region (G) 1703 and the layer region (S) 1704 constituting the light receiving layer 1702, are fluorine, chlorine, bromine and iodine, particularly preferably fluorine and chlorine.

In the present invention, formation of the layer region (G) 1703 constituted of a-Ge(Si,H,X) may be conducted according to the vacuum deposition method utilizing discharging phenomenon similarly as in the case of a-SiGe(H,X). For example, for formation of the layer region (G) constituted of a-Ge(Si,H,X) according to the glow discharge method, the basic procedure comprises introducing a starting gas for Ge supply capable of supplying germanium atoms (Ge) optionally together with a starting gas for Si supply capable of supplying silicon atoms (Si), and a starting gas for introduction of hydrogen atoms (H) and/or a starting gas for introduction of halogen atoms (X) into a deposition chamber which can be internally brought to a reduced pressure, and exciting glow discharge in said deposition chamber, thereby forming a layer consisting of a-Ge(Si,H,X) on the surface of a substrate set at a predetermined position while controlling the depth profile of germanium atoms according to a desired change rate curve. Alternatively, for formation according to the sputtering method, when carrying out sputtering by use of two sheets of targets of a target constituted of Si and a target constituted of Ge, or a target of a mixture of Si and Ge in an atmosphere of an inert gas such as Ar, He, etc. or a gas mixture based on these gases, if desired, a gas for introduction of hydrogen atoms (H) and/or halogen atoms (X) may be introduced into a deposition chamber for sputtering.

For the starting gases to be used for formation of the layer region (G) in the present invention, all the starting gases as mentioned in explanation of formation of the layer comprising a-SiGe(H,X) can be used.

Figure 18:
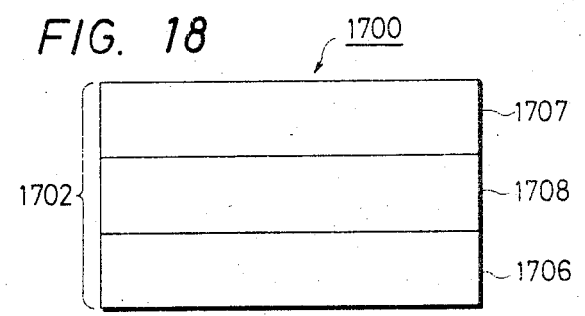

As shown in FIG. 18, the light receiving layer 1702 of the photoconductive member 1700 shown in FIG. 17, contains nitrogen atoms similarly as in the light receiving layer 102 shown in FIG. 1, and has a first layer region (1) 1706 with the nitrogen atom content C(N) of a value C(1), a second layer region (2) 1707 of a value C(2) and a third layer region (3) 1708 of a value C(3).

The first layer region (1) 1706, the second layer region (2) 1707 and the third layer region (3) 1708 constituting the light receiving layer 1702 each may be explained similarly as explained in the case of the photoconductive member 100 as shown in FIG. 1.

According to a preferred embodiment of the present invention, the amount of hydrogen atoms (H) or the amount of halogen atoms (X) or the sum of the amounts of hydrogen atoms and halogen atoms (H+X) to be contained in the layer region (G) 1703 constituting the light receiving layer 1702 to be formed should preferably be 0.01 to 40 atomic %, more preferably 0.05 to 30 atomic %, most preferably 0.1 to 25 atomic %.

For controlling the amount of hydrogen atoms (H) and/or halogen atoms (X) to be contained in the layer region (G) 1703, for example, the substrate temperature and/or the amount of the starting materials used for incorporation of hydrogen atoms (H) or halogen atoms (X) to be introduced into the deposition device system, discharging power, etc. may be controlled.

For formation of the layer region (S) 1704 constituted of a-Si(H,X) in FIG. 17, the starting materials (I) for formation of the layer region (G) 1703, from which the starting material for the starting gas for supplying Ge is omitted, are used as the starting materials (II) for formation of the layer region (S) 1704, and layer formation can be effected following the same procedure and conditions as in formation of the layer region (G) 1703.

More specifically, in the present invention, formation of the layer region (S) 1704 constituted of a-S(H,X) may be carried out according to the vacuum deposition method utilizing discharging phenomenon such as the glow discharge method, the sputtering method or the ion-plating method. For example, for formation of the layer region (S) 1704 constituted of a-Si(H,X) according to the glow discharge method, the basic procedure comprises introducing a starting gas for Si supply capable of supplying silicon atoms as described above, optionally together with starting gases for introduction of hydrogen atoms (H) and/or halogen atoms (X), into a deposition chamber which can be brought internally to a reduced pressure and exciting glow discharge in said deposition chamber, thereby forming a layer comprising a-Si(H,X) on a desired substrate placed at a predetermined position. Alternatively, for formation according to the sputtering method, gases for introduction of hydrogen atoms (H) and/or halogen atoms (X) may be introduced into a deposition chamber when effecting sputtering of a target constituted of Si in an inert gas such as Ar, He, etc. or a gas mixture based on these gases.

Also, in the photoconductive member 1700 shown in FIG. 17, by incorporating a substance (C) for controlling conductivity in the layer region (G) 1703 containing germanium atoms and/or in the layer region (S) 1704 containing no germanium atom, the conductivities of said layer region (G) 1703 and/or said layer region (S) 1704 can be controlled freely as desired.

The amount of hydrogen atoms (H) or the amount of halogen atoms (X) or the sum of the amounts of hydrogen atoms and halogen atoms (H+X) to be contained in the second layer region (S) 1704 constituting the light receiving layer 1702 to be formed should preferably be 1 to 40 atomic %, more preferably 5 to 30 atomic %, most preferably 5 to 25 atomic %.

The descriptions about the photoconductive member 100 shown in FIG. 1 other than those described about the photoconductive member 1700 in FIG. 17 are all applicable to the photoconductive member 1700.

Figure 19:
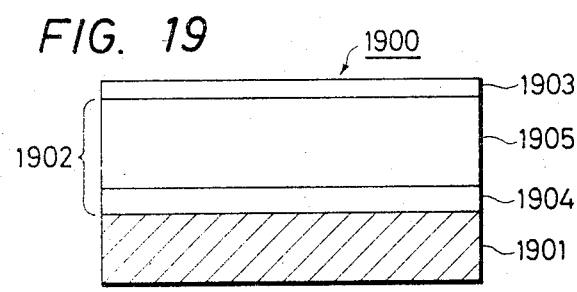

FIG. 19 shows a schematic illustration of the layer structure of a fourth preferred embodiment of the photoconductive member of the present invention.

The photoconductive member 1900 shown in FIG. 19, having a substrate 1901 for photoconductive member, a first layer (I) 1902 provided on said substrate 1901 and a second layer (II) 1903 provided on said first layer (I) 1902, is the same as the photoconductive member 1700 shown in FIG. 17 expect for having the second layer (II) 1903 provided in the photoconductive member 1900. That is, the first layer (I) 1902 corresponds to the light receiving layer 1702, the first layer region (G) 1904 to the first layer region (G) 1703, the second layer region (S) 1905 to the second layer region (S) 1704, and all the descriptions about the light receiving layer 1700 in FIG. 17 are applicable to the first layer (I) 1902.

The second layer (II) 1903 is similar to the second layer (II) 1603 in the photoconductive member 1600 shown in FIG. 16 and all the descriptions about the second layer (II) 1603 are applicable to the second layer (II) 1903.

The photoconductive member of the present invention designed to have such a layer constitution as described in detail above can solve all of the various problems as mentioned above and exhibit very excellent electrical, optical, photoconductive characteristics, dielectric strength and use environment characteristics.

In particular, the photoconductive member of the present invention is free from any influence from residual potential on image formation when applied for an image forming member for electrophotography, with its electrical characteristics being stable with high sensitivity, having a high SN ratio as well as excellent light fatigue resistance and excellent repeated use characteristic and being capable of providing images of high quality of high density, clear halftone and high resolution repeatedly and stably.

Also, in the photoconductive member of the present invention, the light receiving layer provided on the substrate is itself tough and markedly excellent in adhesion to the substrate, and therefore it can be used continuously for a long time repeatedly at high speed.

Further, the photoconductive member of the present invention is high in photosensitivity over all the visible light region, particularly excellent in matching to semiconductor laser and rapid in response to light.

Next, an example of the process for producing the photoconductive member of this invention is to be briefly described.

Figure 20:
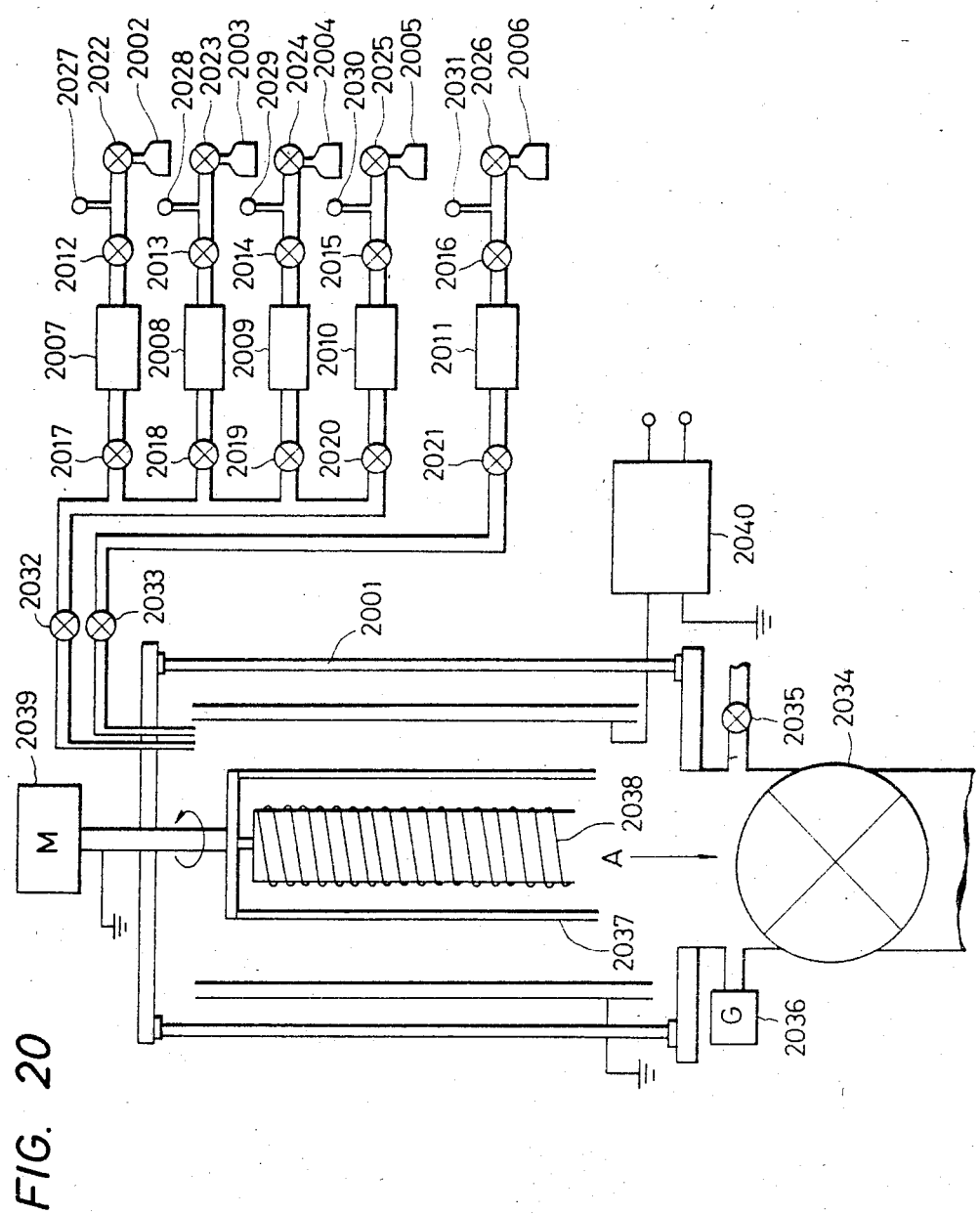
FIG. 20 is a schematic illustration of the device used in the present invention.

FIG. 20 shows one example of a device for producing a photoconductive member.

In the gas bombs 2002-2006 there are hermetically contained starting gases for formation of the photoconductive member of the present invention. For example, 2002 is a bomb containing $SiH_4$ gas diluted with He (purity: 99.999%, hereinafter abbreviated as "$SiH_4$/He"), 2003 is a bomb containing $GeH_4$ gas diluted with He (purity 99.999%, hereinafter abbreviated as "$GeH_4$/He"), 2004 is a $NH_3$ gas bomb (purity: 99.99%), 2005 is a He gas bomb (purity: 99.999%) and 2006 is a $H_2$ gas bomb (purity: 99.999%).

For allowing these gases to flow into the reaction chamber 2001, on confirmation of the valves 2022-2026 of the gas bombs 2002-2006 and the leak valve 2035 to be closed, and the inflow valves 2012-2016, the outflow valves 2017-2021 and the auxiliary valves 2032, 2033 to be opened, the main valve 2034 is first opened to evacuate the reaction chamber 2001 and the gas pipelines. As the next step, when the reading on the vacuum indicator 2036 becomes $5 \times 10^{-6}$ Torr, the auxiliary valves 2032, 2033 and the outflow valves 2017-2021 are closed.

Referring now to an example of forming a light receiving layer region on the cylindrical substrate 2037, $SiH_4$/He gas from the gas bomb 2002, $GeH_4$/He gas from the gas bomb 2003, $NH_3$ gas from the gas bomb 2004 are permitted to flow into the mass-flow controllers 2007, 2008, 2009, respectively, by opening the valves 2022, 2023 and 2024 and controlling the pressures at the outlet pressure gauges 2027, 2028, 2029 to 1 $Kg/cm^2$ and opening gradually the inflow valves 2012, 2013 and 2014, respectively. Subsequently, the outflow valves 2017, 2018, 2019 and the auxiliary valve 2032 are gradually opened to permit respective gases to flow into the reaction chamber 2001. The outflow valves 2017, 2018, 2019 are controlled so that the flow rate ratio of $SiH_4$/He, $GeH_4$/He and $NH_3$ gases may have a desired value and opening of the main valve 2034 is also controlled while watching the reading on the vacuum indicator 2036 so that the pressure in the reaction chamber may reach a desired value. And, after confirming that the temperature of the substrate 2037 is set at 50°–400° C. by the heater 2038, the power source 2040 is set at a desired power to excite glow discharge in the reaction chamber 2001, and at the same time depth profiles of germanium atoms and nitrogen atoms C(N) contained in the layer formed are controlled by carrying out the operation to change gradually the flow rates of GeH$_4$/He gas and NH$_3$ gas according to the change rate curve previously designed by operation of the valves 2018 and 2020 manually or according to an externally driven motor, etc.

As described above, the first layer region (G) is formed on the substrate 2037 to a desired layer thickness by maintaining the glow discharge for a desired period of time. At the stage when the first layer region (G) is formed to a desired thickness, following the same conditions and the procedure except for completely closing the outflow valve 2018 and changing the discharging conditions, if desired, glow discharging is maintained for a desired period of time, whereby the second layer region (S) containing substantially no germanium atom can be formed on the first layer region (G).

For incorporating a substance (C) for controlling the conductivity into the first layer region (G) and the second layer region (S), gases such as B$_2$H$_6$, PH$_3$ etc. may be added to the gases to be introduced into the deposition chamber 2001 during formation of the first layer region (G) and the second layer region (S).

Thus, a first layer (I) is formed on the substrate.

Formation of a second layer (II) on the first layer (I) may be performed by supplying, for example, SiH$_4$ gas and C$_2$H$_4$ gas and/or NO gas, optionally diluted with a diluting gas such as He, into the reaction chamber 2001 according to the same valve operation as in formation of the first layer (I), and exciting glow discharge following the desirable conditions.

For incorporation of halogen atoms in the second layer (II), for example, SiF$_4$ gas and C$_2$H$_4$ gas and/or NO gas, or a gas mixture further added with SiH$_4$ gas, may be used to form the second layer (II) according to the same procedure as described above.

During formation of the respective layers, outflow valves other than those for necessary gases should of course be closed. Also, during formation of respective layers, in order to avoid remaining of the gas employed for formation of the preceding layer in the reaction chamber 2001 and the gas pipelines from the outflow valves 2017–2021 to the reaction chamber 2001, the operation of evacuating the system to high vacuum by closing the outflow valves 2017–2021, opening the auxiliary valves 2032, 2033 and opening fully the main valve 2034 is conducted, if necessary.

The amount of carbon atoms contained in the second layer (II) can be controlled as desired by, for example, in the case of glow discharge, changing the flow rate ratio of SiH$_4$ gas to C$_2$H$_4$ gas to be introduced into the reaction chamber 2001 as desired, or in the case of layer formation by sputtering, changing the sputtering area ratio of silicon wafer to graphite wafer and/or SiO$_2$ wafer, or molding a target with the use of mixture of silicon powder and graphite powder, and/or SiO$_2$ powder at a desired mixing ratio. The content of halogen atoms (X) contained in the second layer (II) can be controlled by controlling the flow rate of the starting gas for introduction of halogen atoms such as SiF$_4$ gas when introduced into the reaction chamber 2001.

Also, for uniformization of the layer formation, it is desirable to rotate the substrate 2037 by means of a motor 2039 at a constant speed during layer formation.

The present invention is described in more detail by referring to the following Examples.

EXAMPLE 1

By means of the device shown in FIG. 20, respective samples of image forming members for electrophotography (see Samples No. 11-1A to 13-6A in Table 2A) were prepared, respectively, on cylindrical aluminum substrates under the conditions shown in Table 1A.

The depth profiles of germanium atoms in respective samples are shown in FIG. 21, and those of nitrogen atoms in FIG. 22.

Each of the samples thus obtained was set in a charging-exposure testing device and subjected to corona charging at ⊕ 5.0 KV for 0.3 sec., followed immediately by irradiation of a light image. The light image was irradiated by means of a tungsten lamp light source at a dose of 2 lux.sec through a transmission type test chart.

Immediately thereafter, ⊖ chargeable developer (containing toner and carrier) was cascaded on the surface of the image forming member to give a good toner image on the surface of the image forming member. When the toner image was transferred onto a transfer paper by corona charging of ⊖ 5.0 KV, a clear image of high density with excellent resolution and good gradation reproducibility was obtained in every sample.

The same experiments were repeated under the same toner image forming conditions as described above, except for using GaAs type semiconductor laser (10 mW) of 810 nm in place of the tungsten lamp as the light source, and image quality evaluation was performed for each sample. As the result, an image of high quality, excellent in resolution and good in gradation reproducibility, could be obtained in every sample.

EXAMPLE 2

By means of the device shown in FIG. 20, respective samples of image forming members for electrophotography (see Samples No. 21-1A to 23-6A in Table 4A) were prepared, respectively, on cylindrical aluminum substrates under the conditions shown in Table 3A.

The depth profiles of the germanium atoms in respective samples are shown in FIG. 21, and those of nitrogen atoms in FIG. 22.

For each of these samples, the same image evaluation test was conducted as in Example 1 to give a toner transferred image of high quality in each sample. Also, for each sample, usage test repeated for 200,000 times was performed under the environment of 38° C. and 80% RH. As the result, no lowering in image quality was observed in each sample.

EXAMPLE 3

By means of the device shown in FIG. 20, respective samples of image forming members for electrophotography (see Samples No. 11-1B to 13-6B in Table 2B) were prepared, respectively, on cylindrical aluminum substrates under the conditions shown in Table 1B.

The depth profiles of germanium atoms in respective samples are shown in FIG. 21, and those of nitrogen atoms in FIG. 22.

Each of the samples thus obtained was set in a charging-exposure testing device and subjected to corona charging at ⊕ 5.0 KV for 0.3 sec., followed immediately by irradiation of a light image. The light image was irradiated by means of a tungsten lamp light source at a dose of 2 lux.sec through a transmission type test chart.

Immediately thereafter, ⊖ chargeable developer (containing toner and carrier) was cascaded on the surface of the image forming member to give a good toner image on the surface of the image forming member. When the toner image was transferred onto a transfer paper by corona charging of ⊕ 5.0 KV, a clear image of high density with excellent resolution and good gradation reproducibility was obtained in every sample.

The some experiments were repeated under the same toner image forming conditions as described above, except for using GaAs type semiconductor laser (10 mW) of 810 nm in place of the tungsten lamp as the light source, and image quality evaluation was performed for each sample. As the result, an image of high quality, excellent in resolution and good in gradation reproducibility, could be obtained in every sample.

EXAMPLE 4

By means of the device shown in FIG. 20, respective samples of image forming members for electrophotography (see Samples No. 21-1B to 23-6B in Table 4B) were prepared, respectively, on cylindrical aluminum substrates under the conditions shown in Table 3B.

The depth profiles of the germanium atoms in respective samples are shown in FIG. 21, and those of nitrogen atoms in FIG. 22.

For each of these samples, the same image evaluation test was conducted as in Example 3 to give a toner transferred image of high quality in each sample. Also, for each sample, usage test repeated for 200,000 times was performed under the environment of 38° C. and 80% RH. As the result, no lowering in image quality was observed in each sample.

EXAMPLE 5

Following the same conditions and the procedure as in Samples Nos. 11-1B, 12-1B and 13-1B in Example 3, except for changing the conditions for preparation of the second layer (II) to the respective conditions as shown in Table 5B, image forming members for electrophotography were prepared, respectively (24 Samples of Sample No. 11-1-1B to 11-1-8B, 12-1-1B to 12-1-8B, 13-1-1B to 13-1-8B). The respective image forming members for electrophotography thus prepared were individually set on a copying device, and according to the conditions as described in respective Examples, overall image quality and durability in continuous use were evaluated for each of the image forming members for electrophotography corresponding to respective Examples.

The results of the overall image quality evaluation and evaluation of durability by repeated continuous use for respective samples are shown in Table 6B.

EXAMPLE 6

Various image forming members were prepared according to the same method as in Sample No. 11-1B in Example 3, respectively, except for varying the content ratio of silicon atoms to carbon atoms in the layer (II) by varying the target area ratio of silicon wafer to graphite wafer during formation of the layer (II). For each of the image forming members thus obtained, the steps of image formation, developing and cleaning as described in Example 3 were repeated for about 50,000 times, and thereafter image evaluations were conducted to obtain the results as shown in Table 7B.

EXAMPLE 7

Various image forming members were prepared according to the same method as in Sample No. 12-1B in Example 3, respectively, except for varying the content ratio of silicon atoms to carbon atoms in the layer (II) by varying the flow rate ratio of $SiH_4$ gas to $C_2H_4$ gas during formation of the layer (II). For each of the image forming members thus obtained, the steps up to transfer were repeated for about 50,000 times according to the methods as described in Example 3, and thereafter image evaluations were conducted to obtain the results as shown in Table 8B.

EXAMPLE 8

Various image forming members were prepared according to the same method as in Sample No. 13-1B in Example 3, respectively, except for varying the content ratio of silicon atoms to carbon atoms in the layer (II) by varying the flow rate ratio of $SiH_4$ gas $SiF_4$ gas and $C_2H_4$ gas during formation of the layer (II). For each of the image forming members thus obtained, the steps of image formation, developing and cleaning as described in Example 3 were repeated for about 50,000 times, and thereafter image evaluations were conducted to obtain the results as shown in Table 9B.

EXAMPLE 9

Respective image forming members were prepared in the same manner as in Sample No. 11-1B in Example 3, except for changing the layer thickness of the layer (II), and the steps of image formation, developing and cleaning as described in Example 3 were repeated to obtain the results as shown in Table 10B.

EXAMPLE 10

By means of the device shown in FIG. 20, respective samples of image forming members for electrophotography (see Samples No. 11-1C to 13-6C in Table 2C) were prepared, respectively, on cylindrical aluminum substrates under the conditions shown in Table 1C.

The depth profiles of germanium atoms in respective samples are shown in FIG. 21, and those of nitrogen atoms in FIG. 22.

Each of the samples thus obtained was set in a charging-exposure testing device and subjected to corona charging at ⊕ 5.0 KV for 0.3 sec., followed immediately by irradiation of a light image. The light image was irradiated by means of a tungsten lamp light source at a dose of 2 lux.sec through a transmission type test chart.

Immediately thereafter, ⊖ chargeable developer (containing toner and carrier) was cascaded on the surface of the image forming member to give a good toner image on the surface of the image forming member. When the toner image was transferred onto a transfer paper by corona charging of ⊕ 5.0 KV, a clear image of high density with excellent resolution and good gradation reproducibility was obtained in every sample.

The same experiments were repeated under the same toner image forming conditions as described above, except for using GaAs type semiconductor laser (10 mW) of 810 nm in place of the tungsten lamp as the light source, and image quality evaluation was performed for each sample. As the result, an image of high quality, excellent in resolution and good in gradation reproducibility, could be obtained in every sample.

EXAMPLE 11

By means of the device shown in FIG. 20, respective samples of image forming members for electrophotography (see Samples No. 21-1C to 23-6C in Table 4C) were prepared, respectively, on cylindrical aluminum substrates under the conditions shown in Table 3C. In Table 3C, the first layer region in the first layer (I) was formed on the aluminum substrate, and the second layer region was formed on the first layer region.

The depth profiles of the germanium atoms in respective samples are shown in FIG. 21, and those of nitrogen atoms in FIG. 22.

For each of these samples, the same image evaluation test was conducted as in Example 10 to give a toner transferred image of high quality in each sample. Also, for each sample, usage test repeated for 200,000 times was performed under the environment of 38° C. and 80% RH. As the result, no lowering in image quality was observed in each sample.

EXAMPLE 12

Following the same conditions and the procedure as in Samples Nos. 11-1C, 12-1C and 13-1C in Example 10, except for changing the conditions for preparation of the second layer (II) to the respective conditions as shown in Table 5C, image forming members for electrophotography were prepared, respectively (24 Samples of Sample No. 11-1-1C to 11-1-8C, 12-1-1C to 12-1-8C, 13-1-1C to 13-1-8C). The respective image forming members for electrophotography thus prepared were individually set on a copying device, and according to the conditions as described in respective Examples, overall image quality and durability in continuous use were evaluated for each of the image forming members for electrophotography corresponding to respective Example.

The results of the overall image quality evaluation and evaluation of durability by repeated continuous use for respective samples are shown in Table 6C.

EXAMPLE 13

Various image forming members were prepared according to the same method as in Sample No. 11-1C in Example 10, respectively, except for varying the content ratio of silicon atoms to oxygen atoms in the second layer (II) by varying the target area ratio of silicon wafer to SiO$_2$ wafer during formation of the second layer (II). For each of the image forming members thus obtained, the steps of image formation, developing and cleaning as described in Example 10 were repeated for about 50,000 times, and thereafter image evaluations were conducted to obtain the results as shown in Table 7C.

EXAMPLE 14

Various image forming members were prepared according to the same method as in Sample No. 12-1C in Example 10, respectively, except for varying the content ratio of silicon atoms to oxygen atoms in the second layer (II) by varying the flow rate ratio of SiH$_4$ gas to NO gas during formation of the second layer (II). For each of the image forming members thus obtained, the steps up to transfer were repeated for about 50,000 times according to the methods as described in Example 10, and thereafter image evaluations were conducted to obtain the results as shown in Table 8C.

EXAMPLE 15

Various image forming members were prepared according to the same method as in Sample No. 13-1C in Example 10, respectively, except for varying the content ratio of silicon atoms to oxygen atoms in the second layer (II) by varying the flow rate ratio of SiH$_4$ gas, SiF$_4$ gas and NO gas during formation of the second layer (II). For each of the image forming members thus obtained, the steps of image formation, developing and cleaning as described in Example 10 were repeated for about 50,000 times, and thereafter image evaluations were conducted to obtain the results as shown in Table 9C.

EXAMPLE 16

Respective image forming members were prepared in the same manner as in Sample No. 11-1C in Example 10, except for changing the layer thickness of the second layer (II), and the steps of image formation, developing and cleaning as described in Example 10 were repeated to obtain the results as shown in Table 10C.

EXAMPLE 17

By means of the device shown in FIG. 20, respective samples of image forming members for electrophotography (see Samples No. 11-1D to 17-6D in Table 2D) were prepared, respectively, on cylindrical aluminum substrates under the conditions shown in Table 1D.

The depth profiles of germanium atoms in respective samples are shown in FIG. 21, and those of nitrogen atoms in FIG. 22.

Each of the samples thus obtained was set in a charging-exposure testing device and subjected to corona charging at $\oplus$ 5.0 KV for 0.3 sec., followed immediately by irradiation of a light image. The light image was irradiated by means of a tungsten lamp light source at a dose of 2 lux.sec through a transmission type test chart.

Immediately thereafter, $\ominus$ chargeable developer (containing toner and carrier) was cascaded on the surface of the image forming member to give a good toner image on the surface of the image forming member. When the toner image was transferred onto a transfer paper by corona charging of $\oplus$ 5.0 KV, a clear image of high density with excellent resolution and good gradation reproducibility was obtained in every sample.

The same experiments were repeated under the same toner image forming conditions as described above, except for using GaAs type semiconductor laser (10 mW) of 810 nm in place of the tungsten lamp as the light source, and image quality evaluation was performed for each sample. As the result, an image of high quality, excellent in resolution and good in gradation reproducibility, could be obtained in every sample.

EXAMPLE 18

By means of the device shown in FIG. 20, respective samples of image forming members for electrophotography (see Samples No. 21-1D to 27-6D in Table 4D) were prepared, respectively, on cylindrical aluminum substrates under the conditions shown in Table 3D.

The depth profiles of the germanium atoms in respective samples are shown in FIG. 21, and those of nitrogen atoms in FIG. 22.

For each of these samples, the same image evaluation test was conducted as in Example 17 to give a toner transferred image of high quality in each sample. Also, for each sample, usage test repeated for 200,000 times was performed under the environment of 38° C. and 80% RH. As the result, no lowering in image quality was observed in each sample.

EXAMPLE 19

By means of the device shown in FIG. 20, respective samples of image forming members for electrophotography (see Samples No. 11-1E to 17-6E in Table 2E) were prepared, respectively, on cylindrical aluminum substrates under the conditions shown in Table 1E.

The depth profiles of germanium atoms in respective samples are shown in FIG. 21, and those of nitrogen atoms in FIG. 22.

Each of the samples thus obtained was set in a charging-exposure testing device and subjected to corona charging at ⊕ 5.0 KV for 0.3 sec., followed immediately by irradiation of a light image. The light image was irradiated by means of a tungsten lamp light source at a dose of 2 lux.sec through a transmission type test chart.

Immediately thereafter, ⊖ chargeable developer (containing toner and carrier) was cascaded on the surface of the image forming member to give a good toner image on the surface of the image forming member. When the toner image was transferred onto a transfer paper by corona charging of ⊕ 5.0 KV, a clear image of high density with excellent resolution and good gradation reproducibility was obtained in every sample.

The same experiments were repeated under the same toner image forming conditions as described above, except for using GaAs type semiconductor laser (10 mW) of 810 nm in place of the tungsten lamp as the light source, and image quality evaluation was performed for each sample. As the result, an image of high quality, excellent in resolution and good in gradation reproducibility, could be obtained in every sample.

EXAMPLE 20

By means of the device shown in FIG. 20, respective samples of image forming members for electrophotography (see Samples No. 21-1E to 27-6E in Table 4E) were prepared, respectively, on cylindrical aluminum substrates under the conditions shown in Table 3E.

The depth profiles of the germanium atoms in respective samples are shown in FIG. 21, and those of nitrogen atoms in FIG. 22.

For each of these samples, the same image evaluation test was conducted as in Example 19 to give a toner transferred image of high quality in each sample. Also, for each sample, usage test repeated for 200,000 times was performed under the environment of 38° C. and 80% RH. As the result, no lowering in image quality was observed in each sample.

EXAMPLE 21

Following the same conditions and the procedure as in Samples Nos. 11-1E, 12-1E and 13-1E in Example 19, except for changing the conditions for preparation of the second layer (II) to the respective conditions as shown in Table 5E, image forming members for electrophotography were prepared, respectively (24 Samples of Sample No. 11-1-1E to 11-1-8E, 12-1-1E to 12-1-8E, 13-1-1-1E to 13-1-8E). The respective image forming members for electrophotography thus prepared were individually set on a copying device, and according to the conditions as described in respective Examples, overall image quality and durability in continuous use were evaluated for each of the image forming members for electrophotography corresponding to respective Examples.

The results of the overall image quality evaluation and evaluation of durability by repeated continuous use for respective samples are shown in Table 6E.

EXAMPLE 22

Various image forming members were prepared according to the same method as in Sample No. 11-1E in Example 19, respectively, except for varying the content ratio of silicon atoms to carbon atoms in the second layer (II) by varying the target area ratio of silicon wafer to graphite during formation of the second layer (II). For each of the image forming members thus obtained, the steps of image formation, developing and cleaning as described in Example 19 were repeated for about 50,000 times, and thereafter image evaluations were conducted to obtain the results as shown in Table 7E.

EXAMPLE 23

Various image forming members were prepared according to the same method as in Sample No. 12-1E in Example 19, respectively, except for varying the content ratio of silicon atoms to carbon atoms in the second layer (II) by varying the flow rate ratio of $SiH_4$ gas to $C_2H_4$ gas during formation of the second layer (II). For each of the image forming members thus obtained, the steps up to transfer were repeated for about 50,000 times according to the methods as described in Example 19, and thereafter image evaluations were conducted to obtain the results as shown in Table 8E.

EXAMPLE 24

Various image forming members were prepared according to the same method as in Sample No. 13-1E in Example 19, respectively, except for varying the content ratio of silicon atoms to carbon atoms in the second layer (II) by varying the flow rate ratio of $SiH_4$ gas, $SiF_4$ gas and $C_2H_4$ gas during formation of the second layer (II). For each of the image forming members thus obtained, the steps of image formation, developing and cleaning as described in Example 19 were repeated for about 50,000 times, and thereafter image evaluations were conducted to obtain the results as shown in Table 9E.

EXAMPLE 25

Respective image forming members were prepared in the same manner as in Sample No. 11-1E in Example 19, except for changing the layer thickness of the second layer (II), and the steps of image formation, developing and cleaning as described in Example 19 were repeated to obtain the results as shown in Table 10E.

EXAMPLE 26

By means of the device shown in FIG. 20, respective samples of image forming members for electrophotography (see Samples No. 11-1F to 17-6F in Table 2F) were prepared, respectively, on cylindrical aluminum substrates under the conditions shown in Table 1F.

The depth profiles of germanium atoms in respective samples are shown in FIG. 21, and those of nitrogen atoms in FIG. 22.

Each of the samples thus obtained was set in a charging-exposure testing device and subjected to corona charging at ⊕ 5.0 KV for 0.3 sec., followed immediately by irradiation of a light image. The light image was irradiated by means of a tungsten lamp light source at a dose of 2 lux.sec through a transmission type test chart.

Immediately thereafter, ⊖ chargeable developer (containing toner and carrier) was cascaded on the surface of the image forming member to give a good toner image on the surface of the image forming member. When the toner image was transferred onto a transfer paper by corona charging of ⊕ 5.0 KV, a clear image of high density with excellent resolution and good gradation reproducibility was obtained in every sample.

The same experiments were repeated under the same toner image forming conditions as described above, except for using GaAs type semiconductor laser (10 mW) of 810 nm in place of the tungsten lamp as the light source, and image quality evaluation was performed for each sample. As the result, an image of high quality, excellent in resolution and good in gradation reproducibility, could be obtained in every sample.

EXAMPLE 27

By means of the device shown in FIG. 20, respective samples of image forming members for electrophotography (see Samples No. 21-1F to 27-6F in Table 4F) were prepared, respectively, on cylindrical aluminum substrates under the conditions shown in Table 3F.

The depth profiles of the germanium atoms in respective samples as shown in FIG. 21, and those of nitrogen atoms in FIG. 22.

For each of these samples, the same image evaluation test was conducted as in Example 26 to give a toner transferred image of high quality in each sample. Also, for each sample, usage test repeated for 200,000 times was performed under the environment of 38° C. and 80% RH. As the result, no lowering in image quality was observed in each sample.

EXAMPLE 28

Following the same conditions and the procedure as in Samples Nos. 11-1F, 12-1F and 13-1F in Example 26, except for changing the conditions for preparation of the second layer (II) to the respective conditions as shown in Table 5F, image forming members for electrophotography were prepared, respectively (24 Samples of Sample No. 11-1-1F to 11-1-8F, 12-1-1F to 12-1-8F, 13-1-1F to 13-1-8F). The respective image forming members for electrophotography thus prepared were individually set on a copying device, and according to the conditions as described in respective Examples, overall image quality and durability in continuous use were evaluated for each of the image forming members for electrophotography corresponding to respective Example.

The results of the overall image quality evaluation and evaluation of durability by repeated continuous use for respective samples are shown in Table 6F.

EXAMPLE 29

Various image forming members were prepared according to the same method as in Sample No. 11-1F in Example 26, respectively, except for varying the content ratio of silicon atoms to oxygen atoms in the second layer (II) by varying the target area ratio of silicon wafer to $SiO_2$ wafer during formation of the second layer (II). For each of the image forming members thus obtained, the steps of image formation, developing and cleaning as described in Example 26 were repeated for about 50,000 times, and thereafter image evaluations were conducted to obtain the results as shown in Table 7F.

EXAMPLE 30

Various image forming members were prepared according to the same method as in Sample No. 12-1F in Example 26, respectively, except for varying the content ratio of silicon atoms to oxygen atoms in the second layer (II) by varying the flow rate ratio of $SiH_4$ gas to NO gas during formation of the second layer (II). For each of the image forming members thus obtained, the steps up to transfer were repeated for about 50,000 times according to the methods as described in Example 26, and thereafter image evaluations were conducted to obtain the results as shown in Table 8F.

EXAMPLE 31

Various image forming members were prepared according to the same method as in Sample No. 13-1F in Example 26, respectively, except for varying the content ratio of silicon atoms to oxygen atoms in the second layer (II) by varying the flow rate ratio of $SiH_4$ gas, $SiF_4$ gas and NO gas during formation of the second layer (II). For each of the image forming members thus obtained, the steps of image formation, developing and cleaning as described in Example 26 were repeated for about 50,000 times, and thereafter image evaluations were conducted to obtain the results as shown in Table 9F.

EXAMPLE 32

Respective image forming members were prepared in the same manner as in Sample No. 11-1F in Example 26, except for changing the layer thickness of the second layer (II), and the steps of image formation, developing and cleaning as described in Example 26 were repeated to obtain the results as shown in Table 10F.

The common layer forming conditions in the respective Examples of the present invention are shown below:
  Substrate temperature: Germanium atom (Ge) containing layer about 200° C. No germanium atom (Ge) containing layer about 250° C.
  Discharging frequency: 13.56 MHz
  Inner pressure in reaction chamber during the reaction: 0.3 Torr.

TABLE 1A

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Light receiving layer | SiF$_4$/He = 0.5<br>GeF$_4$/He = 0.5<br>NH$_3$<br>H$_2$ | SiF$_4$ + GeF$_4$ = 200 | $\dfrac{(SiF_4 + GeF_4)}{(H_2 + SiF_4 + GeF_4)} = 7/10$ | 0.18 | 15 | 25 |

TABLE 2A

| Depth profile of N | Sample No. | Depth profile of Ge | | |
|---|---|---|---|---|
| | | 2101 | 2102 | 2103 |
| 2201 | | 11-1A | 12-1A | 13-1A |
| 2202 | | 11-2A | 12-2A | 13-2A |
| 2203 | | 11-3A | 12-3A | 13-3A |
| 2204 | | 11-4A | 12-4A | 13-4A |
| 2205 | | 11-5A | 12-5A | 13-5A |
| 2206 | | 11-6A | 12-6A | 13-6A |

TABLE 4A-continued

| Depth profile of N | Sample No. | Depth profile of Ge | | |
|---|---|---|---|---|
| | | 2101 | 2102 | 2103 |
| 2204 | | 21-4A | 22-4A | 23-4A |
| 2205 | | 21-5A | 22-5A | 23-5A |
| 2206 | | 21-6A | 22-6A | 23-6A |

TABLE 1B

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | SiF$_4$/He = 0.5<br>GeF$_4$/He = 0.5<br>NH$_3$<br>H$_2$ | SiF$_4$ + GeF$_4$ = 200 | $\dfrac{(SiF_4 + GeF_4)}{(H_2 + SiF_4 + GeF_4)} = 7/10$ | 0.18 | 15 | 25 |
| Layer (II) | SiH$_4$/He = 0.5<br>C$_2$H$_4$ | SiH$_4$ = 100 | SiH$_4$/C$_2$H$_4$ = 3/7 | 0.18 | 10 | 0.5 |

TABLE 3A

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | SiF$_4$/He = 0.5<br>GeF$_4$/He = 0.5<br>NH$_3$<br>H$_2$<br>B$_2$H$_6$/He = 1 × 10$^{-3}$ | SiF$_4$ + GeF$_4$ = 200 | $\dfrac{(SiF_4 + GeF_4)}{(H_2 + SiF_4 + GeF_4)} = 7/10$<br>$\dfrac{B_2H_6}{(SiF_4 + GeF_4)} = 2 \times 10^{-3}$ | 0.18 | 15 | 5 |
| Layer (II) | SiF$_4$/He = 0.5<br>GeF$_4$/He = 0.5<br>NH$_3$<br>H$_2$ | SiF$_4$ + GeF$_4$ = 200 | $\dfrac{(SiF_4 + GeF_4)}{(H_2 + SiF_4 + GeF_4)} = 7/10$ | 0.18 | 15 | 20 |

TABLE 4A

| Depth profile of N | Sample No. | Depth profile of Ge | | |
|---|---|---|---|---|
| | | 2101 | 2102 | 2103 |
| 2201 | | 21-1A | 22-1A | 23-1A |
| 2202 | | 21-2A | 22-2A | 23-2A |
| 2203 | | 21-3A | 22-3A | 23-3A |

TABLE 2B

| Depth profile of N | Sample No. | Depth profile of Ge | | |
|---|---|---|---|---|
| | | 2101 | 2102 | 2103 |
| 2201 | | 11-1B | 12-1B | 13-1B |
| 2202 | | 11-2B | 12-2B | 13-2B |
| 2203 | | 11-3B | 12-3B | 13-3B |
| 2204 | | 11-4B | 12-4B | 13-4B |
| 2205 | | 11-5B | 12-5B | 13-5B |
| 2206 | | 11-6B | 12-6B | 13-6B |

TABLE 3B

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer region | SiF$_4$/He = 0.5<br>GeF$_4$/He = 0.5<br>NH$_3$<br>H$_2$<br>B$_2$H$_6$/He = 1 × 10$^{-3}$ | SiF$_4$ + GeF$_4$ = 200 | $\dfrac{(SiF_4 + GeF_4)}{(H_2 + SiF_4 + GeF_4)} = 7/10$<br>$\dfrac{B_2H_6}{(SiF_4 + GeF_4)} = 2 \times 10^{-3}$ | 0.18 | 15 | 5 |

TABLE 3B-continued

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Second layer region | SiF$_4$/He = 0.5<br>GeF$_4$/He = 0.5<br>NH$_3$<br>H$_2$ | SiF$_4$ + GeF$_4$ = 200 | $\frac{(SiF_4 + GeF_4)}{(H_2 + SiF_4 + GeF_4)} = 7/10$ | 0.18 | 15 | 20 |
| Layer (II) | SiH$_4$/He = 0.5<br>C$_2$H$_4$ | SiH$_4$ = 100 | SiH$_4$/C$_2$H$_4$ = 3/7 | 0.18 | 10 | 0.5 |

TABLE 4B

| Depth profile of N | Sample No. | Depth profile of Ge | | |
|---|---|---|---|---|
| | | 2101 | 2102 | 2103 |
| 2201 | | 21-1B | 22-1B | 23-1B |
| 2202 | | 21-2B | 22-2B | 23-2B |
| 2203 | | 21-3B | 22-3B | 23-3B |
| 2204 | | 21-4B | 22-4B | 23-4B |
| 2205 | | 21-5B | 22-5B | 23-5B |
| 2206 | | 21-6B | 22-6B | 23-6B |

TABLE 5B

| Conditions | Gases employed | Flow rate (SCCM) | Flow rate ratio or area ratio | Discharging power (W/cm$^2$) | Layer thickness ($\mu$) |
|---|---|---|---|---|---|
| 5-1B | Ar | 200 | Si wafer:graphite = 1.5:8.5 | 0.3 | 0.5 |
| 5-2B | Ar | 200 | Si wafer:graphite = 0.5:9.5 | 0.3 | 0.3 |
| 5-3B | Ar | 200 | Si wafer:graphite = 6:4 | 0.3 | 1.0 |
| 5-4B | SiH$_4$/He = 1<br>C$_2$H$_4$ | SiH$_4$ = 15 | SiH$_4$:C$_2$H$_4$ = 0.4:9.6 | 0.18 | 0.3 |
| 5-5B | SiH$_4$/He = 0.5<br>C$_2$H$_4$ | SiH$_4$ = 100 | SiH$_4$:C$_2$H$_4$ = 5:5 | 0.18 | 1.5 |
| 5-6B | SiH$_4$/He = 0.5<br>SiF$_4$/He = 0.5<br>C$_2$H$_4$ | SiH$_4$ + SiF$_4$ = 150 | SiH$_4$:SiF$_4$:C$_2$H$_4$ = 1.5:1.5:7 | 0.18 | 0.5 |
| 5-7B | SiH$_4$/He = 0.5<br>SiF$_4$/He = 0.5<br>C$_2$H$_4$ | SiH$_4$ + SiF$_4$ = 15 | SiH$_4$:SiF$_4$:C$_2$H$_4$ = 0.3:0.1:9.6 | 0.18 | 0.3 |
| 5-8B | SiH$_4$/He = 0.5<br>SiF$_4$/He = 0.5<br>C$_2$H$_4$ | SiH$_4$ + SiF$_4$ = 150 | SiH$_4$:SiF$_4$:C$_2$H$_4$ = 3:3:4 | 0.18 | 1.5 |

TABLE 6B

| Layer (II) forming conditions | Sample No./Evaluation | | |
|---|---|---|---|
| 5-1B | 11-1-1B ◎ ○ | 12-1-1B ○ ○ | 13-1-1B ○ ○ |
| 5-2B | 11-1-2B ○ ○ | 12-1-2B ○ ○ | 13-1-2B ○ ○ |
| 5-3B | 11-1-3B ○ ○ | 12-1-3B ○ ○ | 13-1-3B ○ ○ |
| 5-4B | 11-1-4b ◎ ◎ | 12-1-4B ◎ ◎ | 13-1-4B ◎ ◎ |
| 5-5B | 11-1-5B ◎ ○ | 12-1-5B ◎ ○ | 13-1-5B ◎ ○ |
| 5-6B | 11-1-6B ◎ ◎ | 12-1-6B ◎ ◎ | 13-1-6B ◎ ◎ |
| 5-7B | 11-1-7B ○ ○ | 12-1-7B ○ ○ | 13-1-7B ○ ○ |
| 5-8B | 11-1-8B ○ ○ | 12-1-8B ○ ○ | 13-1-8B ○ ○ |

Sample No.
Overall image quality evaluation
Durability evaluation
Evaluation standard:
◎ ... Excellent
○ ... Good

TABLE 7B

| Sample No. | 1301B | 1302B | 1303B | 1304B | 1305B | 1306B | 1307B |
|---|---|---|---|---|---|---|---|
| Si:C Target (Area ratio) | 9:1 | 6.5:3.5 | 4:6 | 2:8 | 1:9 | 0.5:9.5 | 0.2:9.8 |
| Si:C (Content ratio) | 9.7:0.3 | 8.8:1.2 | 7.3:2.7 | 4.8:5.2 | 3:7 | 2:8 | 0.8:9.2 |
| Image quality evaluation | Δ | ○ | ◎ | ◎ | ○ | Δ | x |

◎: Very good
○ : Good
Δ: Sufficiently practically usable
x: Image defect formed

TABLE 8B

| Sample No. | 1401B | 1402B | 1403B | 1404B | 1405B | 1406B | 1407B | 1408B |
|---|---|---|---|---|---|---|---|---|
| SiH$_4$:C$_2$H$_4$ | 9:1 | 6:4 | 4:6 | 2:8 | 1:9 | 0.5:9.5 | 0.35:9.65 | 0.2:9.8 |

TABLE 8B-continued

| Sample No. | 1401B | 1402B | 1403B | 1404B | 1405B | 1406B | 1407B | 1408B |
|---|---|---|---|---|---|---|---|---|
| (Flow rate ratio) Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ⊙ | ⊙ | ⊙ | ○ | Δ | x |

⊙: Very good
○: Good
Δ: Sufficiently practically usable
x: Image defect formed

TABLE 9B

| Sample No. | 1501B | 1502B | 1503B | 1504B | 1505B | 1506B | 1507B | 1508B |
|---|---|---|---|---|---|---|---|---|
| SiH$_4$:SiF$_4$:C$_2$H$_4$ (Flow rate ratio) | 5:4:1 | 3:3.5:3.5 | 2:2:6 | 1:1:8 | 0.6:0.4:9 | 0.2:0.3:9.5 | 0.2:0.15:9.65 | 0.1:0.1:9.8 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ⊙ | ⊙ | ⊙ | ○ | Δ | x |

⊙: Very good
○: Good
Δ: Practically satisfactory
x: Image defect formed

TABLE 10B

| Sample No. | Thickness of layer (II) (μ) | Results |
|---|---|---|
| 1601B | 0.001 | Image defect liable to be formed |
| 1602B | 0.02 | No image defect formed up to successive copying for 20,000 times |
| 1603B | 0.05 | Stable up to successive copying for 50,000 times |
| 1604B | 1 | Stable up to successive copying for 200,000 times |

TABLE 2C

| Depth profile of N | Sample No. | Depth profile of Ge | | |
|---|---|---|---|---|
| | | 2101 | 2102 | 2103 |
| 2201 | | 11-1C | 12-1C | 13-1C |
| 2202 | | 11-2C | 12-2C | 13-2C |
| 2203 | | 11-3C | 12-3C | 13-3C |
| 2204 | | 11-4C | 12-4C | 13-4C |
| 2205 | | 11-5C | 12-5C | 13-5C |
| 2206 | | 11-6C | 12-6C | 13-6C |

TABLE 1C

| Layer constitution | Gases employed | Flow rate (SCCM) | Flow rate ratio | Discharging power (W/cm$^2$) | Layer formation rate (Å/sec) | Layer thickness (μ) |
|---|---|---|---|---|---|---|
| Layer (I) | SiF$_4$/He = 0.5<br>GeF$_4$/He = 0.5<br>NH$_3$<br>H$_2$ | SiF$_4$ + GeF$_4$ = 200 | $\frac{GeF_4}{(H_2 + SiF_4 + GeF_4)}$ = *<br><br>$\frac{NH_3}{SiF_4 + GeF_4}$ = ** | 0.18 | 15 | 25 |
| Layer (II) | SiH$_4$/He = 0.5<br>NO | SiH$_4$ = 100 | SiH$_4$/NO = 3/7 | 0.18 | 10 | 0.5 |

*, **Flow rate ratio was changed with regard to each sample according to the flow rate ratio change rate curve previously designed by controlling automatically the opening of the corresponding valve.

TABLE 3C

| Layer constitution | Gases employed | Flow rate (SCCM) | Flow rate ratio | Discharging power (W/cm$^2$) | Layer formation rate (Å/sec) | Layer thickness (μ) |
|---|---|---|---|---|---|---|
| Layer (I) | | | | | | |
| First layer region | SiF$_4$/He = 0.5<br>GeF$_4$/He = 0.5<br>NH$_3$<br>H$_2$<br>B$_2$H$_6$/He = 1 × 10$^{-3}$ | SiF$_4$ + GeF$_4$ = 200 | $\frac{GeF_4}{(H_2 + SiF_4 + GeF_4)}$ = *<br><br>$\frac{B_2H_6}{(SiF_4 + GeF_4)}$ = 2 × 10$^{-3}$ | 0.18 | 15 | 5 |
| Second layer region | SiF$_4$/He = 0.5<br>GeF$_4$/He = 0.5<br>NH$_3$<br>H$_2$ | SiF$_4$ + GeF$_4$ = 200 | $\frac{GeF_4}{(H_2 + SiF_4 + GeF_4)}$ = * | 0.18 | 15 | 20 |
| Layer (II) | SiH$_4$/He = 0.5<br>NO | SiH$_4$ = 100 | SiH$_4$/NO = 3/7 | 0.18 | 10 | 0.5 |

*Flow rate ratio was changed with regard to each sample according to the flow rate ratio change rate curve previously designed by controlling automatically the opening of the corresponding valve.

TABLE 4C

| Depth profile of N | Sample No. | Depth profile of Ge | | |
|---|---|---|---|---|
| | | 2101 | 2102 | 2103 |
| 2201 | | 21-1C | 22-1C | 23-1C |
| 2202 | | 21-2C | 22-2C | 23-2C |
| 2203 | | 21-3C | 22-3C | 23-3C |
| 2204 | | 21-4C | 22-4C | 23-4C |
| 2205 | | 21-5C | 22-5C | 23-5C |
| 2206 | | 21-6C | 22-6C | 23-6C |

TABLE 5C

| Conditions | Gases employed | Flow rate (SCCM) | Flow rate ratio or area ratio | Discharging power (W/cm$^2$) | Layer thickness ($\mu$) |
|---|---|---|---|---|---|
| 5-1C | Ar | 200 | Si wafer:SiO$_2$ = 1:30 | 0.3 | 0.5 |
| 5-2C | Ar | 200 | Si wafer:SiO$_2$ = 1:60 | 0.3 | 0.3 |
| 5-3C | Ar | 200 | Si wafer:SiO$_2$ = 6:4 | 0.3 | 1.0 |
| 5-4C | SiH$_4$/He = 1 NO | SiH$_4$ = 15 | SiH$_4$:NO = 5:1 | 0.18 | 0.3 |
| 5-5C | SiH$_4$/He = 0.5 NO | SiH$_4$ = 100 | SiH$_4$:NO = 1:1 | 0.18 | 1.5 |
| 5-6C | SiH$_4$/He = 0.5 SiF$_4$/He = 0.5 NO | SiH$_4$ + SiF$_4$ = 150 | SiH$_4$:SiF$_4$:NO = 1:1:1 | 0.18 | 0.5 |
| 5-7C | SiH$_4$/He = 0.5 SiF$_4$/He = 0.5 NO | SiH$_4$ + SiF$_4$ = 15 | SiH$_4$:SiF$_4$:NO = 2:1:4 | 0.18 | 0.3 |
| 5-8C | SiH$_4$/He = 0.5 SiF$_4$/He = 0.5 NO | SiH$_4$ + SiF$_4$ = 150 | SiH$_4$:SiF$_4$:NO = 1:1:3 | 0.18 | 1.5 |

TABLE 6C

| Layer (II) forming conditions | Sample No./Evaluation | | | Sample No. | | Overall image quality evaluation | Durability evaluation |
|---|---|---|---|---|---|---|---|
| 5-1C | 11-1-1C ○ ○ | 12-1-1C ○ ○ | 13-1-1C ○ ○ | | | | |
| 5-2C | 11-1-2C ○ ○ | 12-1-2C ○ ○ | 13-1-2C ○ ○ | | | | |
| 5-3C | 11-1-3C ○ ○ | 12-1-3C ○ ○ | 13-1-3C ○ ○ | | | | |
| 5-4C | 11-1-4C ◉ ○ | 12-1-4C ◉ ○ | 13-1-4C ◉ ○ | | | | |
| 5-5C | 11-1-5C ◉ ○ | 12-1-5C ◉ ○ | 13-1-5C ◉ ○ | | | | |
| 5-6C | 11-1-6C ◉ ○ | 12-1-6C ◉ ○ | 13-1-6C ◉ ○ | | | | |
| 5-7C | 11-1-7C ○ ○ | 12-1-7C ○ ○ | 13-1-7C ○ ○ | | | | |
| 5-8C | 11-1-8C ○ ○ | 12-1-8C ○ ○ | 13-1-8C ○ ○ | | | | |

Evaluation standard:
◉ ... Excellent
○ ... Good

TABLE 7C

| Sample No. | 1301C | 1302C | 1303C | 1304C | 1305C | 1306C | 1307C |
|---|---|---|---|---|---|---|---|
| Si:SiO$_2$ Target (Area ratio) (NO/Ar) | 9:1 (0/1) | 6.5:3.5 (1/1) | 4:10 (1/1) | 2:60 (1/1) | 1:100 (2/1) | 1:100 (3/1) | 1:100 (4/1) |
| Si:O (Content ratio) | 9.7:0.3 | 8.8:1.2 | 7.3:2.7 | 5.0:5.0 | 4.5:5.5 | 4:6 | 3:7 |
| Image quality evaluation | △ | ◉ | ◉ | ○ | ○ | △ | x |

◉: Very good
○: Good
△: Sufficiently practically usable
x: Image defect formed

TABLE 8C

| Sample No. | 1401C | 1402C | 1403C | 1404C | 1405C | 1406C | 1407C |
|---|---|---|---|---|---|---|---|
| SiH$_4$:NO (Flow rate ratio) | 1000:1 | 99:1 | 5:1 | 1:1 | 1:2 | 3:10 | 1:1000 |
| Si:O (Content ratio) | 9.9999:0.0001 | 9.9:0.1 | 9:1 | 6:4 | 5:5 | 3.3:6.7 | 2:8 |
| Image quality evaluation | △ | ○ | ◉ | ○ | ○ | △ | x |

◉: Very good
○: Good
△: Sufficiently practically usable
x: Image defect formed

TABLE 9C

| Sample No. | 1501C | 1502C | 1503C | 1504C | 1505C | 1506C | 1507C |
|---|---|---|---|---|---|---|---|
| SiH$_4$:SiF$_4$:NO (Flow rate ratio) | 500:400:1 | 50:50:1 | 5:5:2 | 5:5:10 | 1:1:4 | 3:3:20 | 1:1:20000 |

TABLE 9C-continued

| Sample No. | 1501C | 1502C | 1503C | 1504C | 1505C | 1506C | 1507C |
|---|---|---|---|---|---|---|---|
| Si:O (Content ratio) | 9.9998:0.0002 | 9.8:0.2 | 8.8:1.2 | 6.3:3.7 | 5.1:4.9 | 3.5:6.5 | 2.3:7.7 |
| Image quality evaluation | Δ | O | ⊙ | ⊙ | O | Δ | O |

⊙: Very good
O : Good
Δ: Sufficiently practically usable
x: Image defect formed

TABLE 10C

| Sample No. | Thickness of layer (II) ($\mu$) | Results |
|---|---|---|
| 1601C | 0.001 | Image defect liable to be formed |
| 1602C | 0.02 | No image defect formed up to successive copying for 20,000 times |
| 1603C | 0.05 | Stable up to successive copying for 50,000 times |
| 1604C | 1 | Stable up to successive copying for 200,000 times |

TABLE 1D

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | SiH$_4$/He = 0.5<br>GeH$_4$/He = 0.5<br>NH$_3$ | SiH$_4$ + GeH$_4$ = 200 | — | 0.18 | 15 | 5 |
| Layer (II) | SiH$_4$/He = 0.5<br>NH$_3$ | SiH$_4$ = 200 | — | 0.18 | 15 | 23 |

TABLE 2D

| Depth profile of N | Sample No. | Depth profile of Ge |||||||
|---|---|---|---|---|---|---|---|
| | | 2101 | 2102 | 2103 | 2104 | 2105 | 2106 | 2107 |
| | 2201 | 11-1D | 12-1D | 13-1D | 14-1D | 15-1D | 16-1D | 17-1D |
| | 2202 | 11-2D | 12-2D | 13-2D | 14-2D | 15-2D | 16-2D | 17-2D |
| | 2203 | 11-3D | 12-3D | 13-3D | 14-3D | 15-3D | 16-3D | 17-3D |
| | 2204 | 11-4D | 12-4D | 13-4D | 14-4D | 15-4D | 16-4D | 17-4D |
| | 2205 | 11-5D | 12-5D | 13-5D | 14-5D | 15-5D | 16-5D | 17-5D |
| | 2206 | 11-6D | 12-6D | 13-6D | 14-6D | 15-6D | 16-6D | 17-6D |

TABLE 3D

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | SiH$_4$/He = 0.5<br>GeH$_4$/He = 0.5<br>NH$_3$<br>B$_2$H$_6$/He = 10$^{-3}$ | SiH$_4$ + GeH$_4$ = 200 | — | 0.18 | 15 | 3 |
| Layer (II) | SiH$_4$/He = 0.5<br>NH$_3$ | SiH$_4$ = 200 | — | 0.18 | 15 | 25 |

TABLE 4D

| Depth profile of N | Sample No. | Depth profile of Ge |||||||
|---|---|---|---|---|---|---|---|
| | | 2101 | 2102 | 2103 | 2104 | 2105 | 2106 | 2107 |
| | 2201 | 21-1D | 22-1D | 23-1D | 24-1D | 25-1D | 26-1D | 27-1D |
| | 2202 | 21-2D | 22-2D | 23-2D | 24-2D | 25-2D | 26-2D | 27-2D |
| | 2203 | 21-3D | 22-3D | 23-3D | 24-3D | 25-3D | 26-3D | 27-3D |
| | 2204 | 21-4D | 22-4D | 23-4D | 24-4D | 25-4D | 26-4D | 27-4D |
| | 2205 | 21-5D | 22-5D | 23-5D | 24-5D | 25-5D | 26-5D | 27-5D |
| | 2206 | 21-6D | 22-6D | 23-6D | 24-6D | 25-6D | 26-6D | 27-6D |

TABLE 1E

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |

TABLE 1E-continued

| Layer constitution | Gases employed | Flow rate (SCCM) | Flow rate ratio | Discharging power (W/cm$^2$) | Layer formation rate (Å/sec) | Layer thickness (μ) |
|---|---|---|---|---|---|---|
| First layer region (G) | SiH$_4$/He = 0.5<br>GeH$_4$/He = 0.5<br>NH$_3$ | SiH$_4$ + GeH$_4$ = 200 | $\frac{GeH_4}{SiH_4 + GeH_4}$ = *<br><br>$\frac{NH_3}{SiH_4 + NH_3}$ = ** | 0.18 | 15 | 3 |
| Second layer region (S) | SiH$_4$/He = 0.5<br>NH$_3$ | SiH$_4$ = 200 | $\frac{NH_3}{SiH_4 + NH_3}$ = ** | 0.18 | 15 | 25 |
| Layer (II) | SiH$_4$/He = 0.5<br>C$_2$H$_4$ | SiH$_4$ = 100 | SiH$_4$/C$_2$H$_4$ = 3/7 | 0.18 | 10 | 0.5 |

*, **Flow rate ratio was changed with regard to each sample according to the flow rate ratio change rate curve previously designed by controlling automatically the opening of the corresponding valve.

TABLE 2E

| Depth profile of N | Sample No. | Depth profile of Ge |  |  |  |  |  |  |
|---|---|---|---|---|---|---|---|---|
|  |  | 2101 | 2102 | 2103 | 2104 | 2105 | 2106 | 2107 |
| 2201 |  | 11-1E | 12-1E | 13-1E | 14-1E | 15-1E | 16-1E | 17-1E |
| 2202 |  | 11-2E | 12-2E | 13-2E | 14-2E | 15-2E | 16-2E | 17-2E |
| 2203 |  | 11-3E | 12-3E | 13-3E | 14-3E | 15-3E | 16-3E | 17-3E |
| 2204 |  | 11-4E | 12-4E | 13-4E | 14-4E | 15-4E | 16-4E | 17-4E |
| 2205 |  | 11-5E | 12-5E | 13-5E | 14-5E | 15-5E | 16-5E | 17-5E |
| 2206 |  | 11-6E | 12-6E | 13-6E | 14-6E | 15-6E | 16-6E | 17-6E |

TABLE 3E

| Layer constitution | Gases employed | Flow rate (SCCM) | Flow rate ratio | Discharging power (W/cm$^2$) | Layer formation rate (Å/sec) | Layer thickness (μ) |
|---|---|---|---|---|---|---|
| Layer (I) |  |  |  |  |  |  |
| First layer region (G) | SiH$_4$/He = 0.5<br>GeH$_4$/He = 0.5<br>NH$_3$<br>B$_2$H$_6$/He = 10$^{-3}$ | SiH$_4$ + GeH$_4$ = 200 | $\frac{GeH_4}{SiH_4 + GeH_4}$ = *<br><br>$\frac{NH_3}{SiH_4 + NH_3}$ = **<br><br>$\frac{B_2H_6}{SiH_4 + GeH_4}$ = 3 × 10$^{-3}$ | 0.18 | 15 | 3 |
| Second layer region (S) | SiH$_4$/He = 0.5<br>NH$_3$ | SiH$_4$ = 200 | $\frac{NH_3}{SiH_4 + NH_3}$ = ** | 0.18 | 15 | 25 |
| Layer (II) | SiH$_4$/He = 0.5<br>C$_2$H$_4$ | SiH$_4$ = 100 | SiH$_4$/C$_2$H$_4$ = 3/7 | 0.18 | 10 | 0.5 |

*, **Flow rate ratio was changed with regard to each sample according to the flow rate ratio change rate curve previously designed by controlling automatically the opening of the corresponding valve.

TABLE 4E

| Depth profile of N | Sample No. | Depth profile of Ge |  |  |  |  |  |  |
|---|---|---|---|---|---|---|---|---|
|  |  | 2101 | 2102 | 2103 | 2104 | 2105 | 2106 | 2107 |
| 2201 |  | 21-1E | 22-1E | 23-1E | 24-1E | 25-1E | 26-1E | 27-1E |
| 2202 |  | 21-2E | 22-2E | 23-2E | 24-2E | 25-2E | 26-2E | 27-2E |
| 2203 |  | 21-3E | 22-3E | 23-3E | 24-3E | 25-3E | 26-3E | 27-3E |
| 2204 |  | 21-4E | 22-4E | 23-4E | 24-4E | 25-4E | 26-4E | 27-4E |
| 2205 |  | 21-5E | 22-5E | 23-5E | 24-5E | 25-5E | 26-5E | 27-5E |
| 2206 |  | 21-6E | 22-6E | 23-6E | 24-6E | 25-6E | 26-6E | 27-6E |

TABLE 5E

| Conditions | Gases employed | Flow rate (SCCM) | Flow rate ratio or area ratio | Discharging power (W/cm$^2$) | Layer thickness (μ) |
|---|---|---|---|---|---|
| 5-1E | Ar | 200 | Si wafer:graphite = 1.5:8.5 | 0.3 | 0.5 |
| 5-2E | Ar | 200 | Si wafer:graphite = 0.5:9.5 | 0.3 | 0.3 |
| 5-3E | Ar | 200 | Si wafer:graphite = 6:4 | 0.3 | 1.0 |

TABLE 5E-continued

| Conditions | Gases employed | Flow rate (SCCM) | Flow rate ratio or area ratio | Discharging power (W/cm$^2$) | Layer thickness ($\mu$) |
|---|---|---|---|---|---|
| 5-4E | SiH$_4$/He = 1<br>C$_2$H$_4$ | SiH$_4$ = 15 | SiH$_4$:C$_2$H$_4$ = 0.4:9.6 | 0.18 | 0.3 |
| 5-5E | SiH$_4$/He = 0.5<br>C$_2$H$_4$ | SiH$_4$ = 100 | SiH$_4$:C$_2$H$_4$ = 5:5 | 0.18 | 1.5 |
| 5-6E | SiH$_4$/He = 0.5<br>SiF$_4$/He = 0.5<br>C$_2$H$_4$ | SiH$_4$ + SiF$_4$ = 150 | SiH$_4$:SiF$_4$:C$_2$H$_4$ = 1.5:1.5:7 | 0.18 | 0.5 |
| 5-7E | SiH$_4$/He = 0.5<br>SiF$_4$/He = 0.5<br>C$_2$H$_4$ | SiH$_4$ + SiF$_4$ = 15 | SiH$_4$:SiF$_4$:C$_2$H$_4$ = 0.3:0.1:9.6 | 0.18 | 0.3 |
| 5-8E | SiH$_4$/He = 0.5<br>SiF$_4$/He = 0.5<br>C$_2$H$_4$ | SiH$_4$ + SiF$_4$ = 150 | SiH$_4$:SiF$_4$:C$_2$H$_4$ = 3:3:4 | 0.18 | 1.5 |

TABLE 6E

| Layer (II) forming conditions | Sample No./Evaluation | | |
|---|---|---|---|
| 5-1E | 11-1-1E<br>○ ○ | 12-1-1E<br>○ ○ | 13-1-1E<br>○ ○ |
| 5-2E | 11-1-2E<br>○ ○ | 12-1-2E<br>○ ○ | 13-1-2E<br>○ ○ |
| 5-3E | 11-1-3E<br>○ ○ | 12-1-3E<br>○ ○ | 13-1-3E<br>○ ○ |
| 5-4E | 11-1-4E<br>⊙ ⊙ | 12-1-4E<br>⊙ ⊙ | 13-1-4E<br>⊙ ⊙ |
| 5-5E | 11-1-5E<br>⊙ ⊙ | 12-1-5E<br>⊙ ⊙ | 13-1-5E<br>⊙ ⊙ |
| 5-6E | 11-1-6E<br>⊙ ⊙ | 12-1-6E<br>⊙ ⊙ | 13-1-6E<br>⊙ ⊙ |
| 5-7E | 11-1-7E<br>○ ○ | 12-1-7E<br>○ ○ | 13-1-7E<br>○ ○ |
| 5-8E | 11-1-8E<br>○ ○ | 12-1-8E<br>○ ○ | 13-1-8E<br>○ ○ |

Sample No.
Overall image quality evaluation  Durability evaluation

Evaluation standard:
⊙ ... Excellent
○ ... Good

TABLE 7E

| Sample No. | 1301E | 1302E | 1303E | 1304E | 1305E | 1306E | 1307E |
|---|---|---|---|---|---|---|---|
| Si:C Target (Area ratio) | 9:1 | 6.5:3.5 | 4:6 | 2:8 | 1:9 | 0.5:9.5 | 0.2:9.8 |
| Si:C (Content ratio) | 9.7:0.3 | 8.8:1.2 | 7.3:2.7 | 4.8:5.2 | 3:7 | 2:8 | 0.8:9.2 |
| Image quality evaluation | Δ | ○ | ⊙ | ⊙ | ○ | Δ | x |

⊙: Very good
○ : Good
Δ: Sufficiently practically usable
x: Image defect formed

TABLE 8E

| Sample No. | 1401E | 1402E | 1403E | 1404E | 1405E | 1406E | 1407E | 1408E |
|---|---|---|---|---|---|---|---|---|
| SiH$_4$:C$_2$H$_4$ (Flow rate ratio) | 9:1 | 6:4 | 4:6 | 2:8 | 1:9 | 0.5:9.5 | 0.35:9.65 | 0.2:9.8 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | ○ | ⊙ | ⊙ | ⊙ | ○ | Δ | x |

⊙: Very good
○ : Good
Δ: Sufficiently practically usable
x: Image defect formed

TABLE 9E

| Sample No. | 1501E | 1502E | 1503E | 1504E | 1505E | 1506E | 1507E | 1508E |
|---|---|---|---|---|---|---|---|---|
| SiH$_4$:SiF$_4$:C$_2$H$_4$ | 5:4:1 | 3:3.5:3.5 | 2:2:6 | 1:1:8 | 0.6:0.4:9 | 0.2:0.3:9.5 | 0.2:0.15:9.65 | 0.1:0.1:9.8 |

TABLE 9E-continued

| Sample No. | 1501E | 1502E | 1503E | 1504E | 1505E | 1506E | 1507E | 1508E |
|---|---|---|---|---|---|---|---|---|
| (Flow rate ratio) Si:C | 9:1 | 7:3 | 5.5:4.5 | 4:6 | 3:7 | 2:8 | 1.2:8.8 | 0.8:9.2 |
| (Content ratio) Image quality evaluation | Δ | ○ | ⊙ | ⊙ | ⊙ | ○ | Δ | x |

⊙: Very good
○ : Good
Δ: Sufficiently practically usable
x: Image defect formed

TABLE 10E

| Sample No. | Thickness of layer (II) ($\mu$) | Results |
|---|---|---|
| 1601E | 0.001 | Image defect liable to be formed |
| 1602E | 0.02 | No image defect formed up to successive copying for 20,000 times |
| 1603E | 0.05 | Stable up to succesive copying for 50,000 times |
| 1604E | 1 | Stable up to successive copying for 200,000 times |

TABLE 1F

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer region (G) | SiH$_4$/He = 0.5 GeH$_4$/He = 0.5 NH$_3$ | SiH$_4$ + GeH$_4$ = 200 | $\frac{GeH_4}{SiH_4 + GeH_4}$ = * $\frac{NH_3}{SiH_4 + NH_3}$ = ** | 0.18 | 15 | 3 |
| Second layer region (S) | SiH$_4$/He = 0.5 NH$_3$ | SiH$_4$ = 200 | $\frac{NH_3}{SiH_4 + NH_3}$ = ** | 0.18 | 15 | 25 |
| Layer (II) | SiH$_4$/He = 0.5 NO | SiH$_4$ = 100 | SiH$_4$/NO = 3/7 | 0.18 | 10 | 0.5 |

*, **Flow rate ratio was changed with regard to each sample according to the flow rate ratio change rate curve previously designed by controlling automatically the opening of the corresponding valve.

TABLE 2F

| Depth profile of N | Sample No. | Depth profile of Ge |||||||
|---|---|---|---|---|---|---|---|---|
| | | 2101 | 2102 | 2103 | 2104 | 2105 | 2106 | 2107 |
| 2201 | | 11-1F | 12-1F | 13-1F | 14-1F | 15-1F | 16-1F | 17-1F |
| 2202 | | 11-2F | 12-2F | 13-2F | 14-2F | 15-2F | 16-2F | 17-2F |
| 2203 | | 11-3F | 12-3F | 13-3F | 14-3F | 15-3F | 16-3F | 17-3F |
| 2204 | | 11-4F | 12-4F | 13-4F | 14-4F | 15-4F | 16-4F | 17-4F |
| 2205 | | 11-5F | 12-5F | 13-5F | 14-5F | 15-5F | 16-5F | 17-5F |
| 2206 | | 11-6F | 12-6F | 13-6F | 14-6F | 15-6F | 16-6F | 17-6F |

TABLE 3F

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer region (G) | SiH$_4$/He = 0.5 GeH$_4$/He = 0.5 NH$_3$ B$_2$H$_6$/He = 10 | SiH$_4$ + GeH$_4$ = 200 | $\frac{GeH_4}{SiH_4 + GeH_4}$ = * $\frac{NH_3}{SiH_4 + NH_3}$ = ** $\frac{B_2H_6}{SiH_4 + GeH_4}$ = 3 × 10$^{-3}$ | 0.18 | 15 | 3 |
| Second layer region (S) | SiH$_4$/He = 0.5 NH$_3$ | SiH$_4$ = 200 | $\frac{NH_3}{SiH_4 + NH_3}$ = ** | 0.18 | 15 | 25 |

TABLE 3F-continued

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (II) | SiH$_4$/He = 0.5 NO | SiH$_4$ = 100 | SiH$_4$/NO = 3/7 | 0.18 | 10 | 0.5 |

*, **Flow rate ratio was changed with regard to each sample according to the flow rate ratio change rate curve previously designed by controlling automatically the opening of the corresponding valve.

TABLE 4F

| Depth profile of N | Sample No. | Depth profile of Ge | | | | | | |
|---|---|---|---|---|---|---|---|---|
| | | 2101 | 2102 | 2103 | 2104 | 2105 | 2106 | 2107 |
| | 2201 | 21-1F | 22-1F | 23-1F | 24-1F | 25-1F | 26-1F | 27-1F |
| | 2202 | 21-2F | 22-2F | 23-2F | 24-2F | 25-2F | 26-2F | 27-2F |
| | 2203 | 21-3F | 22-3F | 23-3F | 24-3F | 25-3F | 26-3F | 27-3F |
| | 2204 | 21-4F | 22-4F | 23-4F | 24-4F | 25-4F | 26-4F | 27-4F |
| | 2205 | 21-5F | 22-5F | 23-5F | 24-5F | 25-5F | 26-5F | 27-5F |
| | 2206 | 21-6F | 22-6F | 23-6F | 24-6F | 25-6F | 26-6F | 27-6F |

TABLE 5F

| Conditions | Gases employed | Flow rate (SCCM) | Flow rate ratio or area ratio | Discharging power (W/cm$^2$) | Layer thickness ($\mu$) |
|---|---|---|---|---|---|
| 5-1F | Ar | 200 | Si wafer:SiO$_2$ = 1:30 | 0.3 | 0.5 |
| 5-2F | Ar | 200 | Si wafer:SiO$_2$ = 1:60 | 0.3 | 0.3 |
| 5-3F | Ar | 200 | Si wafer:SiO$_2$ = 6:4 | 0.3 | 1.0 |
| 5-4F | SiH$_4$/He = 1 NO | SiH$_4$ = 15 | SiH$_4$:NO = 5:1 | 0.18 | 0.3 |
| 5-5F | SiH$_4$/He = 0.5 NO | SiH$_4$ = 100 | SiH$_4$:NO = 1:1 | 0.18 | 1.5 |
| 5-6F | SiH$_4$/He = 0.5 SiF$_4$/He = 0.5 NO | SiH$_4$ + SiF$_4$ = 150 | SiH$_4$:SiF$_4$:NO = 1:1:1 | 0.18 | 0.5 |
| 5-7F | SiH$_4$/He = 0.5 SiF$_4$/He = 0.5 NO | SiH$_4$ + SiF$_4$ = 15 | SiH$_4$:SiF$_4$:NO = 2:1:4 | 0.18 | 0.3 |
| 5-8F | SiH$_4$/He = 0.5 SiF$_4$/He = 0.5 NO | SiH$_4$ + SiF$_4$ = 150 | SiH$_4$:SiF$_4$:NO = 1:1:3 | 0.18 | 1.5 |

TABLE 6F

| Layer (II) forming conditions | Sample No./Evaluation | | |
|---|---|---|---|
| 5-1F | 11-1-1F ⊙ ○ | 12-1-1F ⊙ ○ | 13-1-1F ⊙ ○ |
| 5-2F | 11-1-2F ⊙ ○ | 12-1-2F ⊙ ○ | 13-1-2F ⊙ ○ |
| 5-3F | 11-1-3F ⊙ ○ | 12-1-3F ⊙ ○ | 13-1-3F ⊙ ○ |
| 5-4F | 11-1-4F ⊙ ⊙ | 12-1-4F ⊙ ⊙ | 13-1-4F ⊙ ⊙ |
| 5-5F | 11-1-5F ⊙ ⊙ | 12-1-5F ⊙ ⊙ | 12-1-5F ⊙ ⊙ |
| 5-6F | 11-1-6F ⊙ ○ | 12-1-6F ⊙ ○ | 12-1-6F ⊙ ○ |
| 5-7F | 11-1-7F ○ ○ | 12-1-7F ○ ○ | 12-1-7F ○ ○ |
| 5-8F | 11-1-8F ○ ○ | 12-1-8F ○ ○ | 12-1-8F ○ ○ |

Sample No. Overall image quality evaluation | Durability evaluation
Evaluation standard:
⊙ ... Excellent
○ ... Good

TABLE 7F

| Sample No. | 1301F | 1302F | 1303F | 1304F | 1305F | 1306F | 1307F |
|---|---|---|---|---|---|---|---|
| Si:SiO$_2$ Target (Area ratio) (NO/Ar) | 9:1 (0/1) | 6.5:3.5 (1/1) | 4:10 (1/1) | 2:60 (1/1) | 1:100 (2/1) | 1:100 (3/1) | 1:100 (4/1) |
| Si:O (Content ratio) | 9.7:0.3 | 8.8:1.2 | 7.3:2.7 | 5.0:5.0 | 4.5:5.5 | 4:6 | 3:7 |
| Image quality evaluation | Δ | ○ | ⊙ | ⊙ | ○ | Δ | x |

⊙: Very good
○: Good
Δ: Sufficiently practically usable
x: Image defect formed

TABLE 8F

| Sample No. | 1401F | 1402F | 1403F | 1404F | 1405F | 1406F | 1407F |
|---|---|---|---|---|---|---|---|
| $SiH_4:NO$ (Flow rate ratio) | 1000:1 | 99:1 | 5:1 | 1:1 | 1:2 | 3:10 | 1:1000 |
| Si:O (Content ratio) | 9.9999:0.0001 | 9.9:0.1 | 9:1 | 6:4 | 5:5 | 3.3:6.7 | 2:8 |
| Image quality evaluation | Δ | ⊚ | ⊚ | ⊚ | ○ | Δ | x |

⊚: Very good
○ : Good
Δ: Sufficiently practically usable
x: Image defect formed

TABLE 9F

| Sample No. | 1501F | 1502F | 1503F | 1504F | 1505F | 1506F | 1507F |
|---|---|---|---|---|---|---|---|
| $SiH_4:SiF_4:NO$ (Flow rate ratio) | 500:400:1 | 50:50:1 | 5:5:2 | 5:5:10 | 1:1:4 | 3:3:20 | 1:1:2000 |
| Si:O (Content ratio) | 9.9998:0.0002 | 9.8:0.2 | 8.8:1.2 | 6.3:3.7 | 5.1:4.9 | 3.5:6.5 | 2.3:7.7 |
| Image quality evaluation | Δ | ⊚ | ⊚ | ⊚ | ○ | Δ | x |

⊚: Very good
○ : Good
Δ: Sufficiently practically usable
x: Image defect formed

TABLE 10F

| Sample No. | Thickness of layer (II) (μ) | Results |
|---|---|---|
| 1601F | 0.001 | Image defect liable to be formed |
| 1602F | 0.02 | No image defect formed up to successive copying for 20,000 times |
| 1603F | 0.05 | Stable up to succesive copying for 50,000 times |
| 1604F | 1 | Stable up to successive copying for 200,000 times |

We claim:

1. A photoconductive member comprising a substrate for photoconductive member and a light receiving layer having photoconductivity comprising an amorphous material containing silicon atoms and germanium atoms, germanium atoms, and at least one of hydrogen atoms and halogen atoms, and wherein the content of germanium atoms in the light receiving layer is 1 to $9.5 \times 10^5$ atomic percent based on the sum of germanium and silicon atoms, said light receiving layer containing nitrogen atoms and having a first layer region, a third layer region and a second layer region with the nitrogen atom content in the layer thickness direction of C(1), C(3) and (C)2, respectively, in the order from the substrate side with the proviso that when C(3) cannot solely be the maximum and either one of C(1) and C(2) is zero, the other two are not zero and not equal to each other, or when C(3) is zero, the other two are not zero, or when none of C(1), C(2) and C(3) is zero, the three of C(1), C(2) and C(3) cannot be equal at the same time and C(3) cannot solely be the maximum.

2. A photoconductive member according to claim 1, wherein hydrogen atoms are contained in the light receiving layer.

3. A photoconductive member according to claim 1, wherein halogen atoms are contained in the light receiving layer.

4. A photoconductive member according to claim 2, wherein halogen atoms are contained in the light receiving layer.

5. A photoconductive member according to claim 1, wherein the germanium atom are distributed in the light receiving layer ununiformly in the layer thickness direction.

6. A photoconductive member according to claim 1, wherein the germanium atoms are distributed in the light receiving layer uniformly in the layer thickness direction.

7. A photoconductive member according to claim 1, wherein a substance (C) for controlling conductivity is contained in the light receiving layer.

8. A photoconductive member according to claim 7, wherein the substance (C) for controlling conductivity is an atom belonging to the group III of the periodic table.

9. A photoconductive member according to claim 7, wherein the substance (C) for controlling conductivity is an atom belonging to the group V of the periodic table.

10. A photoconductive member according to claim 1, wherein the layer thickness of the third layer region is thicker than that of the first and the second layer regions.

11. A photoconductive member according to claim 1, wherein the layer thickness of the third layer region comprises 1/5 or more of the layer thickness of the light receiving layer.

12. A photoconductive member according to claim 1, wherein the layer thickness of the first layer region is 0.003 to 30μ.

13. A photoconductive member according to claim 1, wherein the layer thickness of the second layer region is 0.003 to 30μ.

14. A photoconductive member according to claim 1, wherein the layer thickness of the third layer region is 1 to 100μ.

15. A photoconductive member according to claim 1, wherein the content of nitrogen atoms is 0.001 to 50 atomic % based on the sum of silicon atoms, germanium atoms and nitrogen atoms in the layer region (N) containing said atoms.

16. A photoconductive member according to claim 7, wherein the content of the substance (C) for controlling conductivity in the light receiving layer is 0.01 to $5 \times 10^4$ atomic ppm.

17. A photoconductive member comprising a substrate for photoconductive member and a light receiving layer comprising a first layer (I) having photoconductivity comprising an amorphous material containing silicon atoms, germanium atoms and at least one of hydrogen and halogen atoms and a second layer (II) comprising an amorphous material containing silicon atoms and at least one of carbon atoms and oxygen atoms, wherein the content of germanium atoms in the light receiving layer is 1 to $9.5 \times 10^5$ atomic ppm based on the sum of germanium and silicon atoms, said first layer (I) containing nitrogen atoms and having a first layer region, a third layer region and a second layer region with the nitrogen atom content in the layer thickness direction of C(1), C(3) and C(2), respectively, in the order from the substrate side with the privso that when C(3) cannot solely be the maximum and either one of C(1) and C(2) is zero, the other two are not zero and not equal to each other, or when C(3) is zero, the other two are not zero, or when none of C(1), C(2) and C(3) is zero, the three of C(1), C(2) and C(3) cannot be equal at the same time and C(3) cannot solely be the maximum.

18. A photoconductive member according to claim 17, wherein hydrogen atoms are contained in the light receiving layer.

19. A photoconductive member according to claim 17, wherein halogen atoms are contained in the light receiving layer.

20. A photoconductive member according to claim 18, wherein halogen atoms are contained in the light receiving layer.

21. A photoconductive member according to claim 17, wherein the germanium atoms are distributed in the first layer (I) ununiformly in the layer thickness direction.

22. A photoconductive member according to claim 17, wherein the germanium atoms are distributed in the first layer (I) uniformly in the layer thickness direction.

23. A photoconductive member according to claim 17, wherein a substance (C) for controlling conductivity is contained in the first layer (I).

24. A photoconductive member according to claim 23, wherein the substance (C) for controlling conductivity is an atom belonging to the group III of the periodic table.

25. A photoconductive member according to claim 23, wherein the substance (C) for controlling conductivity is an atom belonging to the group V of the periodic table.

26. A photoconductive member according to claim 17, wherein the layer thickness of the third layer region is thicker than that of the first and the second layer regions.

27. A photoconductive member according to claim 17, wherein the layer thickness of the third layer region comprises 1/5 or more of the layer thickness of the light receiving layer.

28. A photoconductive member according to claim 17, wherein the layer thickness of the first layer region is 0.003 to 30μ.

29. A photoconductive member according to claim 17, wherein the layer thickness of the second layer region is 0.003 to 30μ.

30. A photoconductive member according to claim 17, wherein the layer thickness of the third layer region is 1 to 100μ.

31. A photoconductive member according to claim 17, wherein the content of nitrogen atoms is 0.001 to 50 atomic % based on the sum of silicon atoms, germanium atoms and nitrogen atoms in the layer region (N) containing said atoms.

32. A photoconductive member according to claim 23, wherein the content of the substance (C) for controlling conductivity in the first layer (I) is 0.01 to $5 \times 10^4$ atomic ppm.

33. A photoconductive member according to claim 17, wherein the layer thickness of the second layer (II) is 0.003 to 30μ.

34. A photoconductive member comprising a substrate for photoconductive member and a light receiving layer provided on said substrate having a layer constitution in which a first layer region (G) comprising an amorphous material containing germanium atoms wherein the content of germanium atoms in the first layer region (G) is 1 to $10 \times 10^5$ atomic ppm, and a second layer region (S) exhibiting photoconductivity comprising an amorphous material containing silicon atoms are successively provided from the substrate side, wherein each of said first layer region (G) and said second layer region (S) contains at least one of hydrogen and halogen atoms, said light receiving layer containing nitrogen atoms and having a first layer region, a third layer region and a second layer region with the nitrogen atom content in the layer thickness direction of C(1), C(3) and C(2), respectively, in the order from the substrate side with the proviso that when C(3) cannot solely be the maximum and either one of C(1) and C(2) is zero, the other two are not zero and not equal to each other, or when C(3) is zero, the other two are not zero, or when none of C(1), C(2) and C(3) is zero, the three of C(1), C(2) and C(3) cannot be equal at the same time and C(3) cannot solely be the maximum.

35. A photoconductive member according to claim 34, wherein hydrogen atoms are contained in at least one of the layer region (G) and the layer region (S).

36. A photoconductive member according to claim 34, wherein halogen atoms are contained in at least one of the layer region (G) and the layer region (S).

37. A photoconductive member according to claim 34, wherein the germanium atoms are distributed in the layer region (G) ununiformly.

38. A photoconductive member according to claim 34, wherein the germanium atoms are distributed in the layer region (G) uniformly.

39. A photoconductive member according to claim 34, wherein a substance (C) for controlling conductivity is contained in the light receiving layer.

40. A photoconductive member according to claim 39, wherein the substance (C) for controlling conductivity is an atom belonging to the group III of the periodic table.

41. A photoconductive member according to claim 39, wherein the substance (C) for controlling conductivity is an atom belonging to the group V of the periodic table.

42. A photoconductive member according to claim 34, wherein the layer thickness of the third layer region is thicker than that of the first and the second layer region.

43. A photoconductive member according to claim 34, wherein the layer thickness of the third layer region comprises 1/5 or more of the layer thickness of the light receiving layer.

44. A photoconductive member according to claim 34, wherein the layer thickness of the first layer region is 0.003 to 30μ.

45. A photoconductive member according to claim 34, wherein the layer thickness of the second layer region is 0.003 to 30μ.

46. A photoconductive member according to claim 34, wherein the layer thickness of the third layer region is 1 to 100μ.

47. A photoconductive member according to claim 34, wherein the content of germanium atoms in the light receiving layer is 1 to $9.5 \times 10^5$ atomic ppm based on the sum with silicon atoms.

48. A photoconductive member according to claim 34, wherein the contnet of nitrogen atoms is 0.001 to 50 atomic % based on the sum of silicon atoms, germanium atoms and nitrogen atoms in the layer region (N) containing said atoms.

49. A photoconductive member according to claim 39, wherein the content of the substance (C) for controlling conductivity in the light receiving layer is 0.01 to $5 \times 10^4$ atomic ppm.

50. A photoconductive member comprising a substrate for photoconductive member and a light receiving layer comprising a first layer (I) having a first layer region (G) comprising an amorphous material containing germanium atoms in amounts from 1 to $10 \times 10^5$ atomic ppm provided on said substrate and a second layer region (S) exhibiting photoconductivity comprising an amorphous material containing silicon atoms provided on said first layer region (G) wherein each of said first layer region (G) and said second layer region (S) contains at least one of hydrogen and halogen atoms, and a second layer (II) comprising an amorphous material containing silicon atoms and at least one of carbon atoms and oxygen atoms provided on said first layer (I), said first layer (I) containing nitrogen atoms and having a first layer region, a third layer region and a second layer region with the nitrogen atom content in the layer thickness direction of C(1), C(3) and C(2), respectively, in the order from the substrate side with the proviso that when C(3) cannot solely be the maximum and either one of C(1) and C(2) is zero, the other two are not zero and not equal to each other, or when C(3) is zero, the other two are not zero, or when none of C(1), C(2) and C(3) is zero, the three of C(1), C(2) and C(3) cannot be equal at the same time and C(3) cannot solely be the maximum.

51. A photoconductive member according to claim 50, wherein hydrogen atoms are contained in at least one of the layer region (G) and the layer region (S).

52. A photoconductive member according to claim 50, wherein halogen atoms are contained in at least one of the layer region (G) and the layer region (S).

53. A photoconductive member according to claim 50, wherein the germanium atoms are distributed in the layer region (G) ununiformly.

54. A photoconductive member according to claim 50, wherein the germanium atoms are distributed in the layer region (G) uniformly.

55. A photoconductive member according to claim 50, wherein a substance (C) for controlling conductivity is contained in the first layer (I).

56. A photoconductive member according to claim 55, wherein the substance (C) for controlling conductivity is an atom belonging to the group III of the periodic table.

57. A photoconductive member according to claim 55, wherein the substance (C) for controlling conductivity is an atom belonging to the group V of the periodic table.

58. A photoconductive member according to claim 50, wherein the layer thickness of the third layer region is thicker than that of the first and the second layer regions.

59. A photoconductive member according to claim 50, wherein the layer thickness of the third layer region comprises 1/5 or more of the layer thickness of the light receiving layer.

60. A photoconductive member according to claim 50, wherein the layer thickness of the first layer region is 0.003 to 30μ.

61. A photoconductive member according to claim 50, wherein the layer thickness of the second layer region is 0.003 to 30μ.

62. A photoconductive member according to claim 50, wherein the layer thickness of the third layer region is 1 to 100μ.

63. A photoconductive member according to claim 50, wherein the content of germanium atoms in the layer region (G) is 1 to $9.5 \times 10^5$ atomic ppm based on the sum with silicon atoms.

64. A photoconductive member according to claim 50, wherein the content of nitrogen atoms is 0.001 to 50 atomic % based on the sum of silicon atoms, germanium atoms and nitrogen atoms in the layer region (N) containing said atoms.

65. A photoconductive member according to claim 55, wherein the content of the substance (C) for controlling conductivity in the first layer (I) is 0.01 to $5 \times 10^4$ atomic ppm.

66. A photoconductive member according to claim 50, wherein the layer thickness of the second layer (II) is 0.003 to 30μ.

67. An electrophotographic process which comprises:
(a) applying a charging treatment to a photoconductive member comprising a substrate for photoconductive member and a light receiving layer having photoconductivity comprising an amorphous material containing silicon atoms, germanium atoms, and at least one of hydrogen atoms and halogen atoms, and wherein the content of germanium atoms in the light receiving layer is 1 to $9.5 \times 10^5$ atomic percent based on the sum of germanium and silicon atoms, said light receiving layer containing nitrogen atoms and having a first layer region, a third layer region and a second layer region with the nitrogen atom content in the layer thickness direction of C(1), C(3) and C(2), respectively, in the order from the substrate side with the proviso that when C(3) cannot solely be the maximum and either one of C(1) and C(2) is zero, the other two are not zero and not equal to each other, or when C(3) is zero, the other two are not zero, or when none of C(1), C(2) and C(3) is zero, the three of C(1), C(2) and C(3) cannot be equal at the same time and C(3) cannot solely be the maximum; and
(b) irradiating said photoconductive member with an electromagnetic wave carrying information, thereby forming an electrostatic image.

68. An electrophotographic process which comprises:
(a) applying a charging treatment to a photoconductive member comprising a substrate for photoconductive member and a light receiving layer comprising a first layer (I) having photoconductivity comprising an amorphous material containing silicon atoms, germanium atoms and at least one of hydrogen and halogen atoms and a second layer (II) comprising an amorphous material containing silicon atoms and at least one of carbon atoms and oxygen atoms, wherein the content of germanium atoms in the light receiving layer is 1 to $9.5 \times 10^5$ atomic ppm based on the sum of germanium and silicon atoms, said first layer (I) containing nitrogen atoms and having a first layer region, a third layer region and a second layer region with the nitrogen atom content in the layer thickness direction of C(1) C(3) and C(2), respectively, in the order from the substrate side with the proviso that when C(3) cannot solely be the maximum and either one of C(1) and C(2) is zero, the other two are not zero and not equal to each other, or when C(3) is zero, the other two are not zero, or when none of C(1), C(2) and C(3) is zero, the three of C(1), C(2) and C(3) cannot be equal at the same time and C(3) cannot solely be the maximum; and (b) irradiating the photoconductive member with an electromagnetic wave carrying information, thereby forming an electrostatic image.

69. An electrophotographic process which comprises:

(a) applying a charging treatment to a photoconductive member comprising a substrate for photoconductive member and a light receiving layer provided on said substrate having a layer constitution in which a first layer region (G) comprising an amorphous material containing germanium atoms in amounts from 1 to $10 \times 10^5$ atomic ppm, and a second layer region (S) exhibiting photoconductivity comprising an amorphous material containing silicon atoms are successively provided from the substrate side, both layer regions (G) and (S) containing at least one of hydrogen and halogen atoms, said light receiving layer containing nitrogen atoms and having a first layer region, a third layer region and a second layer region with the nitrogen atom content in the layer thickness direction of C(1), C(3) and C(2), respectively, in the order from the substrate side with the proviso that when C(3) cannot solely be the maximum and either one of C(1) and C(2) is zero, the other two are not zero and not equal to each other, or when C(3) is zero, the other two are not zero, or when none of C(1), C(2) and C(3) is zero, the three of C(1), C(2) and C(3) cannot be equal at the same time and C(3) cannot solely be the maximum; and (b) irradiating the photoconductive member with an electromagnetic wave carrying information, thereby forming an electrostatic image.

70. An electrophotographic process which comprises:

(a) applying a charging treatment to a photoconductive member comprising a substrate for photoconductive member and a light receiving layer comprising a first layer (I) having a first layer region (G) comprising an amorphous material containing germanium atoms in amounts from 1 to $10 \times 10^5$ atomic ppm provided on said substrate and a second layer region (S) exhibiting photoconductivity comprising an amorphous material containing silicon atoms provided on said first layer region (G), both said layer regions (S) and (G) containing at least one of hydrogen and halogen atoms, and a second layer (II) comprising an amorphous material containing silicon atoms and at least one of carbon atoms and oxygen atoms provided on said first layer (I), said first layer (I) containing nitrogen atoms and having a first layer region, a third layer region and a second layer region with the nitrogen atom content in the layer thickness direction of C(1), C(3) and C(2), respectively, in the order from the substrate side with the proviso that when C(3) cannot solely be the maximum and either one of C(1) and C(2) is zero, the other two are not zero and not equal to each other, or when C(3) is zero, the other two are not zero, or when none of C(1), C(2) and C(3) is zero, the three of C(1), C(2) and C(3) cannot be equal at the same time and C(3) cannot solely be the maximum; and (b) irradiating the photoconductive member with an electromagnetic wave carrying information, thereby forming an electrostatic image.

* * * * *

UNITED STATES PATENT AND TRADEMARK OFFICE
CERTIFICATE OF CORRECTION

Page 1 of 2

PATENT NO. : 4,592,979
DATED : June 3, 1986
INVENTOR(S) : KEISHI SAITOH, ET AL.

It is certified that error appears in the above-identified patent and that said Letters Patent is hereby corrected as shown below:

COLUMN 39
Line 68, "$B_2H_6/He=1\times10^3$" should read --$B_2H_6/He=1\times10^{-3}$--.

COLUMN 41
Line 49 "◎" under "H-1-1B" should read -- O --.

COLUMN 43
Line 10, before ":Very Good" insert -- ◎ --;
Line 11, before ":Good" insert -- O --;
Line 20, before ":Very Good" insert -- ◎ --; and
Line 21, before ":Good" insert -- O --.

COLUMN 53
Line 5, insert "3.5" under column "1502E" across from (Flow rate ratio)"

COLUMN 57
Line 68, "atom" should read --atoms--.

COLUMN 59
Line 16, "privso" should read --proviso--.

UNITED STATES PATENT AND TRADEMARK OFFICE
CERTIFICATE OF CORRECTION

PATENT NO. : 4,592,979
DATED : June 3, 1986
INVENTOR(S) : KEISHI SAITOH, ET AL.

It is certified that error appears in the above-identified patent and that said Letters Patent is hereby corrected as shown below:

COLUMN 61
Line 16, "contnet" should read --content--.

Signed and Sealed this

Seventeenth Day of March, 1987

Attest:

DONALD J. QUIGG

*Attesting Officer*     *Commissioner of Patents and Trademarks*